(12) United States Patent
Leong

(10) Patent No.: US 12,074,588 B2
(45) Date of Patent: Aug. 27, 2024

(54) CASCODE DEVICE WITH ONE OR MORE NORMALLY-ON GATES

(71) Applicant: Infineon Technologies Austria AG, Villach (AT)

(72) Inventor: Kennith Kin Leong, Villach (AT)

(73) Assignee: Infineon Technologies Austria AG, Villach (AT)

( * ) Notice: Subject to any disclaimer, the term of this patent is extended or adjusted under 35 U.S.C. 154(b) by 93 days.

(21) Appl. No.: 17/863,455

(22) Filed: Jul. 13, 2022

(65) Prior Publication Data

US 2024/0022239 A1    Jan. 18, 2024

(51) Int. Cl.
*H03K 17/06* (2006.01)
*H01L 29/20* (2006.01)
(Continued)

(52) U.S. Cl.
CPC ....... *H03K 17/063* (2013.01); *H01L 29/2003* (2013.01); *H03K 17/08104* (2013.01);
(Continued)

(58) Field of Classification Search
None
See application file for complete search history.

(56) References Cited

U.S. PATENT DOCUMENTS 7,164,589 B1   1/2007 Soldano et al.
7,595,680 B2   9/2009 Morita et al.
(Continued)

FOREIGN PATENT DOCUMENTS

CN   102640288 A   8/2012
CN   105871365 A   8/2016
(Continued)

OTHER PUBLICATIONS

Chen, Ren-Yi, et al., "Study and Implementation of a Current-Fed Full-Bridge Boost DC-DC Converter With Zero-Current Switching for High-Voltage Applications", IEEE Transactions on Industry Applications, vol. 44, No. 4, Jul./ Aug. 2008, 1218-1226.
(Continued)

*Primary Examiner* — Kenneth B Wells
(74) *Attorney, Agent, or Firm* — Murphy, Bilak & Homiller, PLLC

(57) ABSTRACT

A switch device includes at least two bidirectional switches electrically connected in a cascode configuration. A first bidirectional switch and a second bidirectional switch of the at least two bidirectional switches each have a normally-on gate and a normally-off gate. Any remaining bidirectional switch of the at least two bidirectional switches cascoded between the first and second bidirectional switches has a first normally-on gate and a second normally-on gate. The switch device is actively controlled by the normally-off gate of the first bidirectional switch and the normally-off gate of the second bidirectional switch. Each normally-on gate of the at least two bidirectional switches is electrically connected to a source of another one of the at least two bidirectional switches by a voltage blocking device configured to block a portion of the voltage across the switch device when the switch device is off. Additional switch devices embodiments are described.

22 Claims, 9 Drawing Sheets

(51) Int. Cl.
*H03K 17/081* (2006.01)
*H03K 17/10* (2006.01)
*H03K 17/687* (2006.01)
*H03K 17/74* (2006.01)

(52) U.S. Cl.
CPC ......... *H03K 17/102* (2013.01); *H03K 17/687* (2013.01); *H03K 17/74* (2013.01); *H03K 2217/0054* (2013.01)

(56) References Cited

U.S. PATENT DOCUMENTS

| | | | |
|---|---|---|---|
| 7,768,758 B2* | 8/2010 | Maier | H03K 17/567 335/7 |
| 7,825,467 B2* | 11/2010 | Willmeroth | H01L 29/4916 257/E29.325 |
| 7,852,137 B2 | 12/2010 | Machida et al. | |
| 7,868,353 B2 | 1/2011 | Machida et al. | |
| 7,875,907 B2 | 1/2011 | Honea et al. | |
| 8,344,424 B2 | 1/2013 | Suh et al. | |
| 8,487,667 B2* | 7/2013 | Iwamura | H03K 17/567 327/108 |
| 8,604,512 B2 | 12/2013 | Morita | |
| 8,649,198 B2* | 2/2014 | Kuzumaki | H02M 7/5387 363/17 |
| 8,664,690 B1 | 3/2014 | Chen et al. | |
| 9,276,569 B2* | 3/2016 | Ikeda | H01L 25/18 |
| 9,443,845 B1 | 9/2016 | Stafanov et al. | |
| 9,472,549 B2* | 10/2016 | Rose | H03K 17/74 |
| 10,224,924 B1 | 3/2019 | Leong | |
| 10,411,698 B2* | 9/2019 | Sato | H03K 17/567 |
| 10,770,455 B2* | 9/2020 | Roig-Guitart | H01L 29/861 |
| 10,784,853 B2 | 9/2020 | Leong | |
| 10,979,032 B1 | 4/2021 | Leong et al. | |
| 11,088,688 B2* | 8/2021 | Pala | H01L 29/1608 |
| 2006/0145744 A1 | 7/2006 | Diorio et al. | |
| 2009/0167411 A1 | 7/2009 | Machida et al. | |
| 2009/0206363 A1 | 8/2009 | Machida et al. | |
| 2010/0155775 A1 | 6/2010 | Gauthier et al. | |
| 2012/0217542 A1 | 8/2012 | Morita | |
| 2012/0262220 A1* | 10/2012 | Springett | H03K 17/567 327/434 |
| 2012/0287688 A1 | 11/2012 | Fornage et al. | |
| 2014/0145208 A1 | 5/2014 | Rose et al. | |
| 2014/0197448 A1 | 7/2014 | Galy et al. | |
| 2014/0203289 A1 | 7/2014 | Liu et al. | |
| 2014/0264431 A1 | 9/2014 | Lal | |
| 2014/0374766 A1 | 12/2014 | Bahl et al. | |
| 2015/0043116 A1 | 2/2015 | Weyers et al. | |
| 2015/0180469 A1 | 6/2015 | Kim | |
| 2015/0256163 A1 | 9/2015 | Weis | |
| 2016/0079233 A1 | 3/2016 | Deboy et al. | |
| 2016/0322485 A1 | 11/2016 | Padmanabhan et al. | |
| 2017/0047841 A1 | 2/2017 | Zojer et al. | |
| 2017/0062419 A1 | 3/2017 | Rose et al. | |
| 2017/0103978 A1 | 4/2017 | Prechtl et al. | |
| 2017/0338809 A1 | 11/2017 | Stefanov et al. | |
| 2018/0219008 A1 | 8/2018 | Prechtl et al. | |
| 2019/0068181 A1 | 2/2019 | Leong | |
| 2019/0199289 A1 | 6/2019 | Wei et al. | |
| 2019/0252921 A1 | 8/2019 | Lethellier et al. | |
| 2019/0326280 A1 | 10/2019 | Imam et al. | |
| 2020/0098745 A1 | 3/2020 | Roig-Guitart | |
| 2020/0287536 A1 | 9/2020 | Udrea et al. | |
| 2022/0157981 A1 | 5/2022 | Gupta et al. | |

FOREIGN PATENT DOCUMENTS

| | | |
|---|---|---|
| EP | 3249815 A1 | 11/2017 |
| TW | 200541073 A | 12/2005 |
| WO | 2005002054 A1 | 1/2005 |
| WO | 2017159559 A1 | 9/2017 |
| WO | 2021206065 A1 | 10/2021 |

OTHER PUBLICATIONS

Chowdhury, Dilder, "GaN FETs: Why cascode?", Sep. 30, 2020, pp. 1-6.

Friedli, Thomas, et al., Design and Performance of a 200-kHz All-SiC JFET Current DC-Link Back-to-Back Converter, IEEE Transactions on Industry Applications, vol. 45, No. 5, Sep./Oct. 2009, 1868-1878.

Kennith, Kin Leong, "Bidirectional Switch with Passive Electrical Network for Substrate Potential Stabilization", U.S. Appl. No. 15/683,217 filed Aug. 22, 2017.

Kolar, J.W., et al., "Novel Three-Phase AC-DC-AC Sparse Matrix Converter", IEEE, 2002, 777-787.

Lindemann, A., "A New IGBT with Reverse Blocking Capability", Entwurf fuer EPE Conference, European Conference on Power Electronics and Applications, Graz, Austria, 2001, Posted to Internet on Sep. 11, 2014, 2001, pp. 1-7.

Siemaszko, Daniel, et al., "Active Self-Switching Methods for Emerging Monolithic Bidirectional Switches Applied to Diode-Less Converters", 2009 13th European Conference on Power Electronics and Applications, Sep. 8-10, 2009, 1-9.

Soeiro, Thiago B., et al., "Three-Phase Modular Multilevel Current Source Rectifiers for Electric Vehicle Battery Charging Systems", IEEE, 2013, 623-629.

U.S. Appl. No. 17/542,660.

"Industry's first 1200V Half Bridge Module based on GaN technology", VisIC Techologies, https://www.psma.com/sites/default/files/uploads/tech-forums-semiconductor/presentations/is012-industrys-first-1200v-half-bridge-module-based-gan-technology.pdf, Nov. 2022, pp. 1-45.

Haehre, K., et al., "Switching Speed-Control of an Optimized Capacitor-Clamped Normally-on Silicon Carbide JFET Cascode", 15th International Power Electronics and Motion Control Conference, EPE-PEMC 2012 ECCE Europe, Novi Sad, Serbia, Sep. 4, 2012, pp. DSla. 11-1-DSla. 11-5.

Li, Xueqing, et al., "Medium Voltage Power Module Based on SiC JFETs", IEEE Applied Power Electronics Conference and Exposition (APEC), Mar. 26, 2017, 3033-3037.

Oladele, Olanrewaju Kabir, et al., "Optimizing Switching Performance of Cascade-Light SiC JFET Bidirectional Switch for Matrix Converter", IEEE International Power Electronics and Application Conference and Exposition (PEAC), 2018, pp. 1-6.

* cited by examiner

CASCODE DEVICE WITH ONE OR MORE NORMALLY-ON GATES

BACKGROUND

Many buffer layers are required in GaN (gallium nitride) technology to withstand at least 1.2 kV, making a single discrete or bidirectional switch device with a breakdown voltage of at least 1.2 kV difficult to realize in GaN. Accordingly, higher voltage rated applications such as 3-phase matrix converters and 3-phase current source inverters are presently difficult to achieve with GaN technology. For discrete devices, a 1.2 kV switch may be realized by stacking two (2) 650V rated devices. This approach has two active gates which requires both gates to be driven exactly at the same time. Otherwise, one 650V device may be stressed more than the other 650V device. For bi-directional blocking devices, two (2) discrete bidirectional switches may be arranged back-to-back to block in both directions while driving both gates either from the same driver or with two individual drivers but supplied from the same auxiliary supply. However, two (2) 1.2 kV discrete devices must be arranged back-to-back to realize a 1.2 kV bi-directional blocking device. This leads to an inefficient utilisation of the two devices, where only one device is blocking in one direction of the voltage but the current conducts through the semiconductor material of both devices. Furthermore, this approach is expensive compared to a discrete component of the same RDSon (on-state resistance) class since the required die size is now approximately four (4) times larger.

Hence, there is a need for an improved 1.2 kV or higher discrete or bidirectional switch that utilizes GaN technology.

SUMMARY

According to an embodiment of a switch device, the switch device comprises: a first power transistor die that includes a normally-on transistor having at most half a maximum rated drain-to-source voltage as the switch device; a second power transistor die that includes a normally-off transistor having at most half the maximum rated drain-to-source voltage as the switch device, wherein a drain of the normally-off transistor is electrically connected to a source of the normally-on transistor to form a cascode device; a voltage blocking device electrically connected between a gate of the normally-on transistor and a source of the normally-off transistor, and configured to block a portion of the voltage across the switch device when the cascode device is off; and an overvoltage protection device configured to turn off the normally-on transistor when the normally-off transistor turns off, such that the cascode device is actively controlled only by a gate of the normally-off transistor.

According to another embodiment of a switch device, the switch device comprises: a first bidirectional switch comprising a first source, a second source, a normally-off gate, and a normally-on gate; a second bidirectional switch comprising a first source electrically connected to the second source of the first bidirectional switch to form a cascode device, a second source, a normally-off gate, and a normally-on gate; a first voltage blocking device electrically connected between the first source of the first bidirectional switch and the normally-on gate of the second bidirectional switch, and configured to block a portion of the voltage across the switch device when the cascode device is off; a first overvoltage protection device configured to turn off the normally-on gate of the first bidirectional switch when the normally-off gate of the second bidirectional switch turns off, such that the normally-on gate of the first bidirectional switch is passively controlled by the normally-off gate of the second bidirectional switch; a second voltage blocking device electrically connected between the second source of the second bidirectional switch and the normally-on gate of the first bidirectional switch, and configured to block a portion of the voltage across the switch device when the cascode device is off; and a second overvoltage protection device configured to turn off the normally-on gate of the second bidirectional switch when the normally-off gate of the first bidirectional switch turns off, such that the normally-on gate of the second bidirectional switch is passively controlled by the normally-off gate of the first bidirectional switch.

According to another embodiment of a switch device, the switch device comprises: a first bidirectional switch comprising a first source, a second source, a normally-off gate, and a normally-on gate; a second bidirectional switch comprising a first source electrically connected to the second source of the first bidirectional switch to form a first part of a cascode device, a second source, a first normally-on gate, and a second normally-on gate; a third bidirectional switch comprising a first source electrically connected to the second source of the second bidirectional switch to form a second part of the cascode device, a second source, a normally-on gate, and a normally-off gate; a first voltage blocking device electrically connected between the first source of the first bidirectional switch and the first normally-on gate of the second bidirectional switch, and configured to block a portion of the voltage across the switch device when the cascode device is off; a first overvoltage protection device configured to turn off the first normally-on gate of the second bidirectional switch when the normally-off gate of the first bidirectional switch turns off, such that the first normally-on gate of the second bidirectional switch is passively controlled by the normally-off gate of the first bidirectional switch; a second voltage blocking device electrically connected between the first source of the third bidirectional switch and the normally-on gate of the first bidirectional switch, and configured to block a portion of the voltage across the switch device when the cascode device is off; a second overvoltage protection device configured to turn off the normally-on gate of the first bidirectional switch when the first normally-on gate of the second bidirectional switch turns off; a third voltage blocking device electrically connected between the second source of the third bidirectional switch and the second normally-on gate of the second bidirectional switch, and configured to block a portion of the voltage across the switch device when the cascode device is off; a third overvoltage protection device configured to turn off the second normally-on gate of the second bidirectional switch when the normally-off gate of the third bidirectional switch turns off, such that the second normally-on gate of the second bidirectional switch is passively controlled by the normally-off gate of the third bidirectional switch; a fourth voltage blocking device electrically connected between the normally-on gate of the third bidirectional switch and the first source of the second bidirectional switch, and configured to block a portion of the voltage across the switch device when the cascode device is off; and a fourth overvoltage protection device configured to turn off the normally-on gate of the third bidirectional switch when the second normally-on gate of the second bidirectional switch turns off, such that the normally-on gate of the third bidirectional switch is passively controlled by the second normally-on gate of the second bidirectional switch.

According to another embodiment of a switch device, the switch device comprises: a first normally off switch; a second normally-off switch; at least two bidirectional switches electrically connected in a cascode configuration between the first normally off switch and the second normally off switch, each bidirectional switch comprising a first normally-on gate and a second normally-on gate; a voltage blocking device electrically connected to one of the normally-on gates of each bidirectional switch and configured to block a portion of the voltage across the switch device when the switch device is off; a first overvoltage protection device configured to turn off the first normally-on gate of each bidirectional switch when the first normally-off switch turns off, such that the first normally-on gate of each bidirectional switch is passively controlled by the first normally-off switch; and a second overvoltage protection device configured to turn off the second normally-on gate of each bidirectional switch when the second normally-off switch turns off, such that the second normally-on gate of each bidirectional switch is passively controlled by the second normally-off switch.

According to another embodiment of a switch device, the switch device comprises at least two bidirectional switches electrically connected in a cascode configuration, wherein a first bidirectional switch and a second bidirectional switch of the at least two bidirectional switches each have a normally-on gate and a normally-off gate, wherein any remaining bidirectional switch of the at least two bidirectional switches cascoded between the first bidirectional switch and the second bidirectional switch has a first normally-on gate and a second normally-on gate, wherein the switch device is actively controlled by the normally-off gate of the first bidirectional switch and the normally-off gate of the second bidirectional switch, wherein each normally-on gate of the at least two bidirectional switches is electrically connected to a source of another one of the at least two bidirectional switches by a voltage blocking device configured to block a portion of the voltage across the switch device when the switch device is off.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

The embodiments described herein provide a 1.2 kV or higher rated switch device implemented using discrete and/or bidirectional switch devices with a lower (<1.2 kV) breakdown voltage, while maintaining the same number of active gates as a single high voltage device and utilising the entire device in terms of voltage blocking and current conduction. In the case of a 1.2 kV rated switch device, the discrete and/or bidirectional switch devices used to implement the switch device have a breakdown voltage of 650V. However, the embodiments described herein may be applied to voltage classes other than 650V and the resulting switch device may have a blocking voltage greater than 1.2 kV. More generally, the switch devices disclosed herein may have a breakdown voltage of at least 1.2 kV and, depending on the number of devices arranged in a cascode configuration, may be implemented using discrete and/or bidirectional switch devices having a breakdown voltage of at most half the breakdown voltage of the switch device.

Described next, with reference to the figures, are exemplary embodiments of switch devices.

Figure 1B:
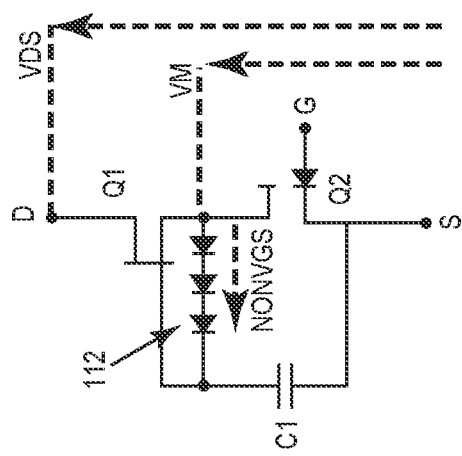
FIG. 1B illustrates the circuit schematic of FIG. 1 with superimposed voltages at different nodes of the circuit.
Figure 1A:
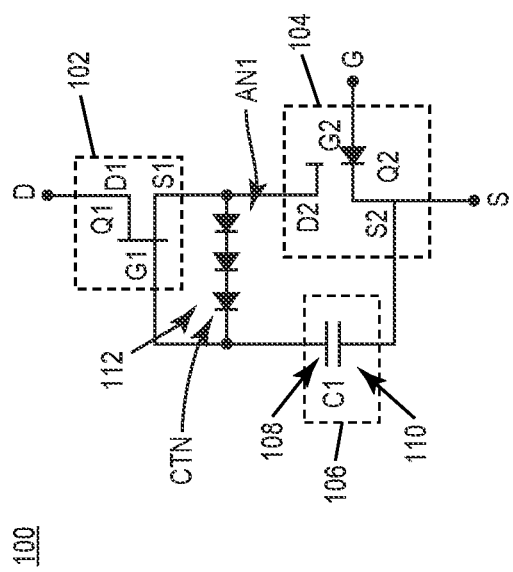
FIG. 1A illustrates a circuit schematic of an embodiment of a unidirectional cascode switch device.

FIG. 1A illustrates an embodiment of a switch device 100. According to this embodiment, the switch device 100 is a unidirectional cascode discrete device based on a first power transistor die (chip) 102 that includes a normally-on (i.e., depletion mode) transistor Q1 and a second power transistor die 104 that includes a normally-off (i.e., enhancement mode) transistor Q2. Both the normally-on transistor Q1 and the normally-off transistor Q2 have at most half the maximum rated drain-to-source (D-to-S) voltage as the switch device 100.

For the normally-on transistor Q1, a current conduction channel is present between the drain and source terminals D1, S1 of the normally-on transistor Q1 absent any voltage being applied to the gate terminal G1 of the normally-on transistor Q1. For the normally-off transistor Q2, a current conduction channel is not present between the drain and source terminals D2, S2 of the normally-off transistor Q2 without a suitable voltage applied to the gate terminal G2 of the normally-off transistor Q2.

In one embodiment, the normally-on transistor Q1 is a normally-on GaN transistor, the normally-off transistor Q2 is a normally-off GaN transistor, and the maximum rated drain-to-source voltage of the switch device 100 is 1.2 kV. In GaN technology, a polarization difference between the GaN channel layer and the AlGaN barrier layer yields a 2-dimensional (2D) 'sheet' of uncompensated charge. The 2D charge sheet is typically positive and causes a 2D electron gas to be formed even if there is no doping. Accordingly, GaN devices tend to be normally-on devices unless an additional device engineering technique such as doping of the barrier with acceptors, gate engineering, etc. is applied to render the device normally-off.

The drain D2 of the normally-off transistor Q2 is electrically connected to the source S1 of the normally-on transistor Q1 to form a cascode device. According to this configuration, the drain D1 of the normally-on transistor Q1 forms the drain D of the cascoded switch device 100 and the source S2 of the normally-off transistor Q2 forms the source S of the cascoded switch device 100. The cascoded switch device 100 has a single actively controlled (driven) gate G formed by the gate G2 of the normally-off transistor Q2.

To maximize utilization of both transistor devices Q1, Q2, the switch device 100 in FIG. 1A also includes a voltage blocking device 106 electrically connected between the gate G1 of the normally-on transistor Q1 and the source S2 of the normally-off transistor Q2. The voltage blocking device 106 blocks a portion of the drain-to-source voltage 'VDS' across the switch device 100 when the cascode device formed by Q1 and Q2 is off. In one embodiment, the voltage blocking device 106 is a capacitor C1 having a first terminal 108 electrically connected to the gate G1 of the normally-on transistor Q1 and a second terminal 110 electrically connected to the source S2 of the normally-off transistor Q2. The voltage blocking capacitor C1 may be in the pF range if the transistors Q1 and Q2 are rated for 650V.

The switch device 100 in FIG. 1A further includes an overvoltage protection device 112 that protects the gate G1 of the normally-on transistor Q1 from overvoltage conditions in the negative direction when the normally-off transistor Q2 turns off. The overvoltage protection device 112 turns off the normally-on transistor Q1 when the normally-off transistor Q2 turns off, such that the cascode device formed by Q1 and Q2 is actively controlled only by the gate G2 of the normally-off transistor Q2. Accordingly, only the normally-off gate G2 is actively controlled (driven) to control the cascode structure and no synchronous driving of the normally-on gate G1 is required.

In one embodiment, the overvoltage protection device 112 includes one or more diodes connected in series between the gate G1 of the normally-on transistor Q1 and the source S1 of the normally-on transistor Q1. The number of diodes depends on the total forward voltage of the overvoltage protection device 112 which should be greater in an absolute sense than the negative threshold voltage of the normally-on transistor Q1, to switch off the normally-on transistor Q1. Accordingly, the overvoltage protection device 112 may include a single diode with the anode AN1 electrically connected to the source S1 of the normally-on transistor Q1 and the cathode CTN electrically connected to the gate G1 of the normally-on transistor Q1. In the case of a plurality of series-connected diodes, e.g., as shown in FIG. 1A, the anode AN1 of the first diode in the series chain is electrically connected to the source S1 of the normally-on transistor Q1 and the cathode CTN of the last diode in the series chain is electrically connected to the gate G1 of the normally-on transistor Q1. The diode(s), e.g., ESD (electrostatic discharge) structure(s), may be monolithically integrated in the same die 102 as the normally-on transistor Q1, for example.

Figure 2A:
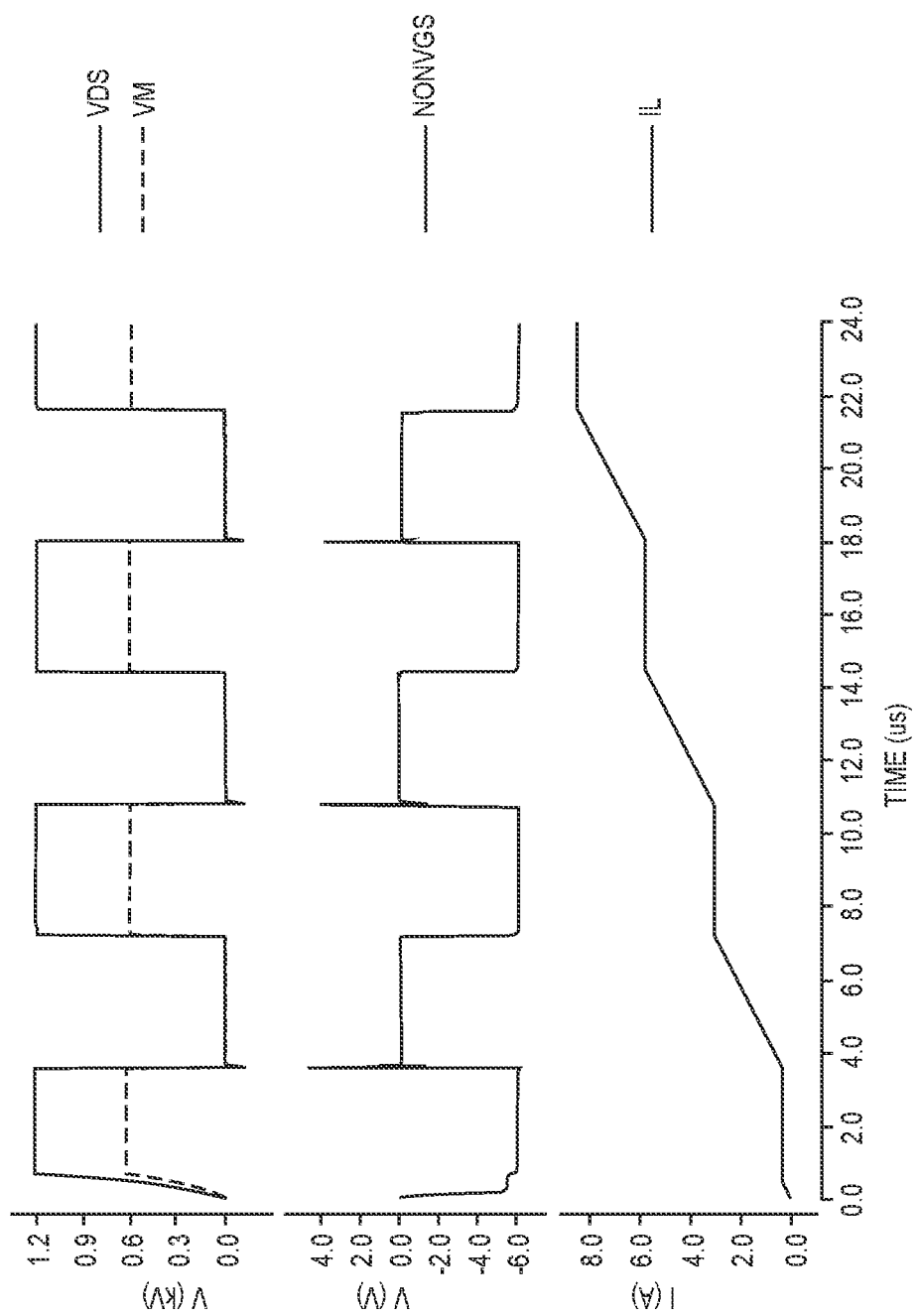
FIGS. 2A and 2B illustrate respective waveform diagrams of the voltages shown in FIG. 1 and load current during operation of the switch device of FIG. 1.

FIG. 1B illustrates the drain-to-source voltage A/DS' of the switch device 100, the voltage 'VM' across the normally-off transistor Q2, and the gate-to-source voltage 'NONVGS' of the normally-on transistor Q1. FIG. 2A is a plot of these voltages and load current IL during operation of the switch device 100. In this example, VDS is 1.2 kV when the switch device 100 is off (blocking).

As shown in FIG. 2A, the voltage 'VM' across the normally-off transistor Q2 and the drain-to-source voltage A/DS' of the switch device 100 both begin to rise when the normally-off transistor Q2 turns off by actively reducing the gate-to-source voltage applied to gate G2 to below the threshold voltage of Q2. As the voltage 'VM' across the normally-off transistor Q2 rises, so too does the voltage across the overvoltage protection device 112. Eventually, the voltage across the overvoltage protection device 112 rises high enough so that the gate-to-source voltage 'NONVGS' of the normally-on transistor Q1 reaches a negative threshold voltage (−6V in this example) and the normally-on transistor Q1 safely turns off before being subjected to an overvoltage condition.

Figure 2B:
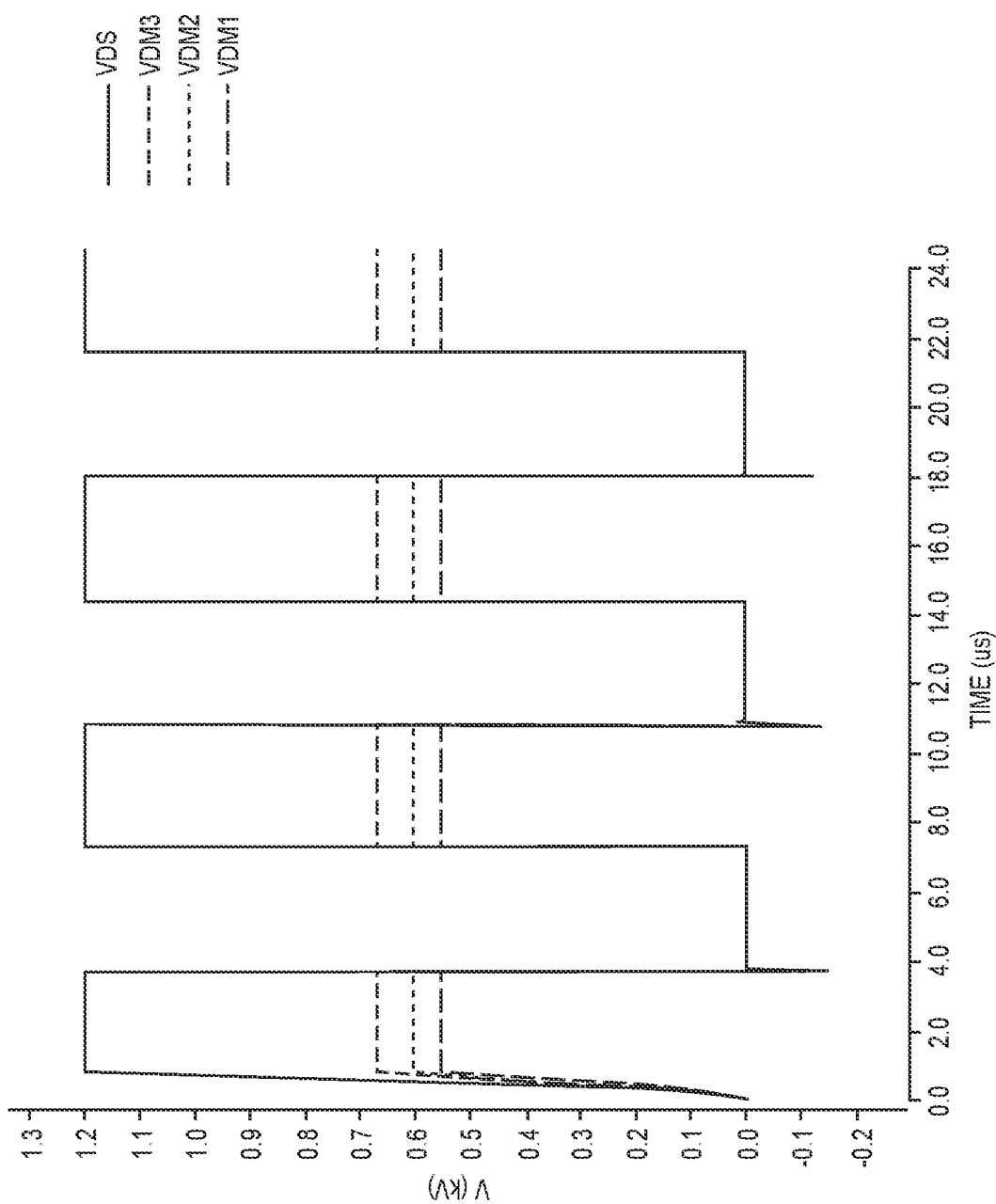

The distribution of the drain-to-source voltage 'VDS' of the switch device 100 is controlled by the value of the voltage blocking device 106. How fast the voltage rises across the overvoltage protection device 112 determines when the normally-on transistor Q1 turns off. That speed depends on the size of capacitor C1. The choice of capacitor size also affects the voltage 'VM' across the normally-off transistor Q2, as shown in FIG. 2B. In FIG. 2B, C1=14 pF yields VM1 of about 560V, C2=17 pF yields VM2 of about 610V, and C3=20 pF yields VM3 of about 670V. In each case, the gate-to-source voltage 'NONVGS' of the normally-on transistor Q1 becomes negative and turns off the normally-on transistor Q1 when the normally-off transistor Q2 turns off.

Even though the distribution of the voltage across the cascode structure formed by transistors Q1 and Q2 can be modified based on a single parameter, the value of C1, the stability of this value must be carefully considered to enable stable performance. Furthermore, since the cascode structure shown in FIG. 1A uses two individual (discrete) dies 102, 104, additional parasitics will be present due to the inter-die connections needed to form the switch device 100.

Figure 3:
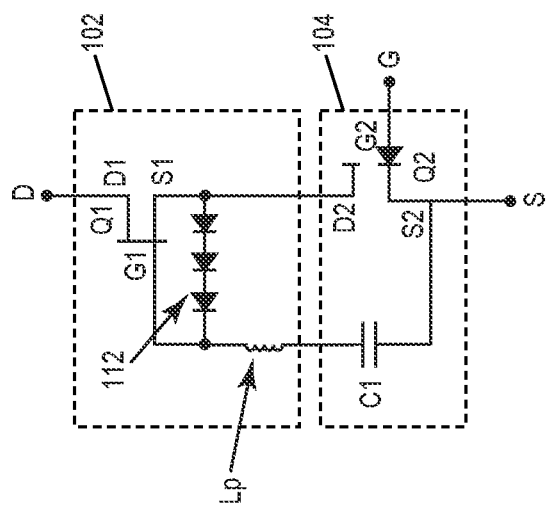
FIG. 3 illustrates the unidirectional cascode switch device of FIG. 1 with stray inductance.

One parasitic that affects switch performance is the stray inductance 'Lp' between the gate G1 of the normally-on transistor Q1 and the capacitor C1 of the voltage blocking device 106, as shown in FIG. 3. This stray inductance 'Lp' could create oscillations that might require further protection for the gate G1 of the normally-on transistor Q1.

Figure 4:
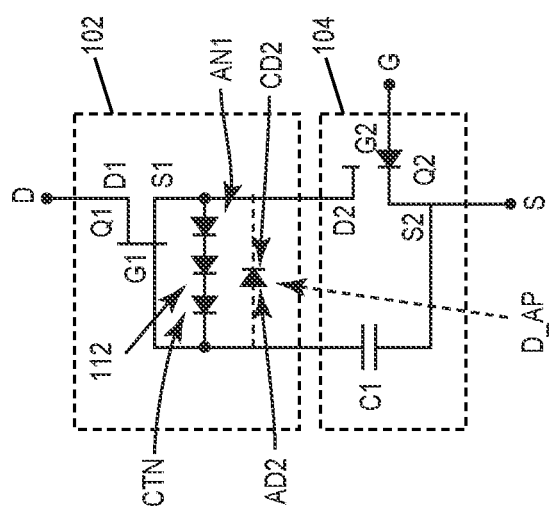
FIG. 4 illustrates a circuit schematic of an embodiment of a circuit that mitigates the stray inductance shown in FIG. 3.

FIG. 4 illustrates an embodiment according to which an additional diode D_AP such as an anti-parallel ESD diode is electrically connected between the gate G1 of the normally-on transistor Q1 and the source S1 of the normally-on transistor Q1 and antiparallel to the diode(s) of the overvoltage protection device 112. The cathode CD2 of the additional diode D_AP is electrically connected to the anode AN1 of the first diode of the overvoltage protection device 112 and the anode AD2 of the additional diode D_AP is electrically connected to the cathode CTN of the last diode of the overvoltage protection device 112.

Figure 5:
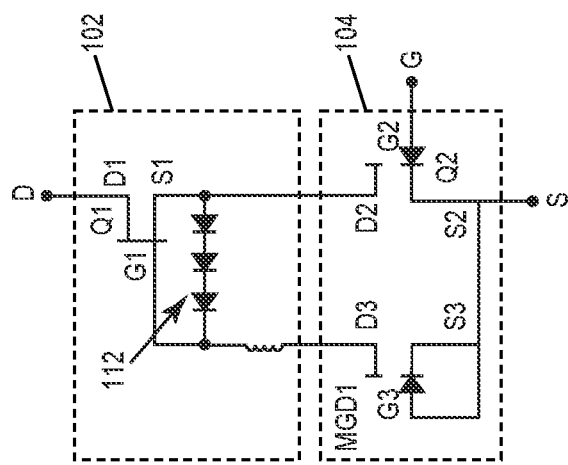
FIG. 5 illustrates a circuit schematic of another embodiment of a circuit that mitigates the stray inductance shown in FIG. 3.

FIG. 5 illustrates an embodiment according to which the capacitor C1 of the voltage blocking device 106 is replaced by another component having a capacitive behavior. The component should block 650V for the 1.2 kV example and have enough capacitance for this function. For example, the component with the capacitive behavior may be a gated diode device MGD1 such as a MOS-gated diode. The gated diode device MGD1 has a drain D3 electrically connected to the gate G1 of the normally-on transistor Q1. Both the gate G3 and the source S3 of the gated diode device MGD1 are electrically connected to the source S2 of the normally-off transistor Q2. The gated diode device MGD1 may be integrated in the same die 104 as the normally-off transistor Q2, reducing the corresponding parasitic inductance illustrated in FIG. 3. This is likely due to the non-linearity of the output capacitance of the gated diode device MGD1.

Figure 6:
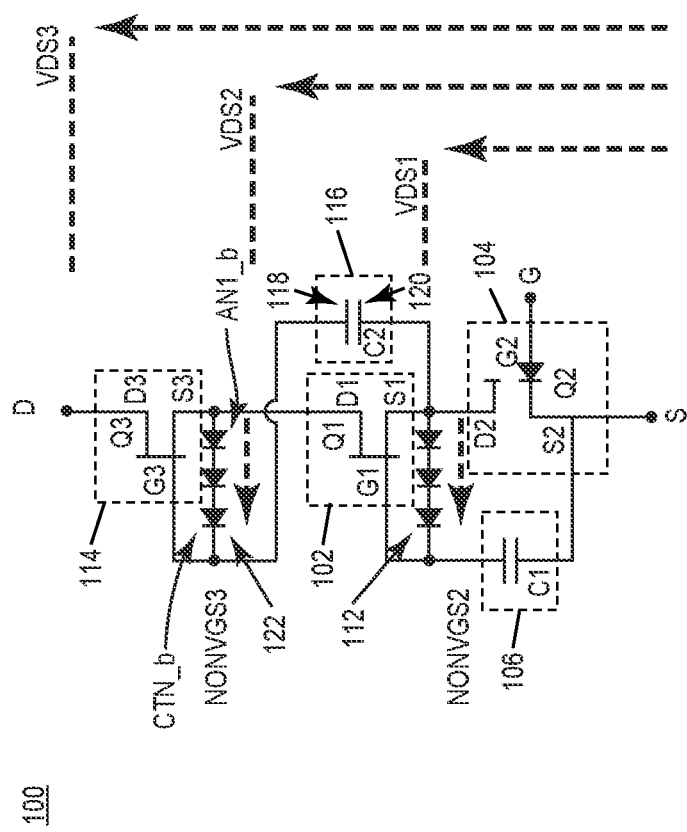
FIG. 6 illustrates a circuit schematic of another embodiment of a unidirectional cascode switch device.

FIG. 6 illustrates another embodiment of the unidirectional cascode discrete switch device 100. In FIG. 6, the cascode configuration is extended to include a third power transistor die 114 that includes an additional normally-on transistor Q3. The source S3 of the additional normally-on transistor Q3 is electrically connected to the drain D1 of the first normally-on transistor Q1.

An additional voltage blocking device 116 is electrically connected between the gate G3 of the additional normally-on transistor Q3 and the source S1 of the first normally-on transistor Q1, for blocking a portion of the voltage across the switch device 100 when the cascode device is off. In one embodiment, the additional voltage blocking device 116 is a capacitor C2 having a first terminal 118 electrically connected to the gate G3 of the additional normally-on transistor Q3 and a second terminal 120 electrically connected to the source S1 of the first normally-on transistor Q1. The distribution of the drain-to-source voltage of the switch device 100 is controlled by the respective values of the voltage blocking devices 106, 116, as previously described herein, and may be in the pF range for 650V rated transistors Q1, Q2, Q3. In another embodiment, the additional voltage blocking device 116 is a gated diode device, e.g., as shown in FIG. 5. In this case, the drain of the gated diode device is electrically connected to the gate G3 of the additional normally-on transistor Q3 and both the gate and source of the gated diode device are electrically connected to the source S1 of the first normally-on transistor Q1.

To ensure the additional normally-on transistor Q3 is protected from overvoltage conditions in the negative direction when the first normally-on transistor Q1 turns off, an additional overvoltage protection device 122 is provided. The additional overvoltage protection device 122 turns off the additional normally-on transistor Q3 when the first normally-on transistor Q1 turns off, such that the cascode device formed by transistors Q1, Q2 and Q3 is actively controlled only by the gate G2 of the normally-off transistor Q2. In one embodiment, the additional overvoltage protection device 122 includes one or more diodes connected in series between the gate G3 of the additional normally-on transistor Q3 and the source S3 of the additional normally-on transistor Q3. The number of diodes depends on the total forward voltage of the additional overvoltage protection device 122, as explained above.

The anode AN1_b of the first diode of the additional overvoltage protection device 122 is electrically connected to the source S3 of the additional normally-on transistor Q3. The cathode CTN_b of the last diode of the additional overvoltage protection device 122 is electrically connected to the gate G3 of the additional normally-on transistor Q3. The first diode and the last diode may be the same diode if a single diode provides the desired total forward voltage of the additional overvoltage protection device 122, or instead are different diodes electrically connected in series.

An additional diode may be electrically connected between the gate G3 of the additional normally-on transistor Q3 and the source S3 of the additional normally-on transistor Q3 and antiparallel to the diode(s) of the additional overvoltage protection device 122, e.g., as shown in FIG. 4 for the first normally-on transistor Q1, to protect against a stray inductance that could otherwise create oscillations at the gate G3 of the additional normally-on transistor Q3.

Figure 7:
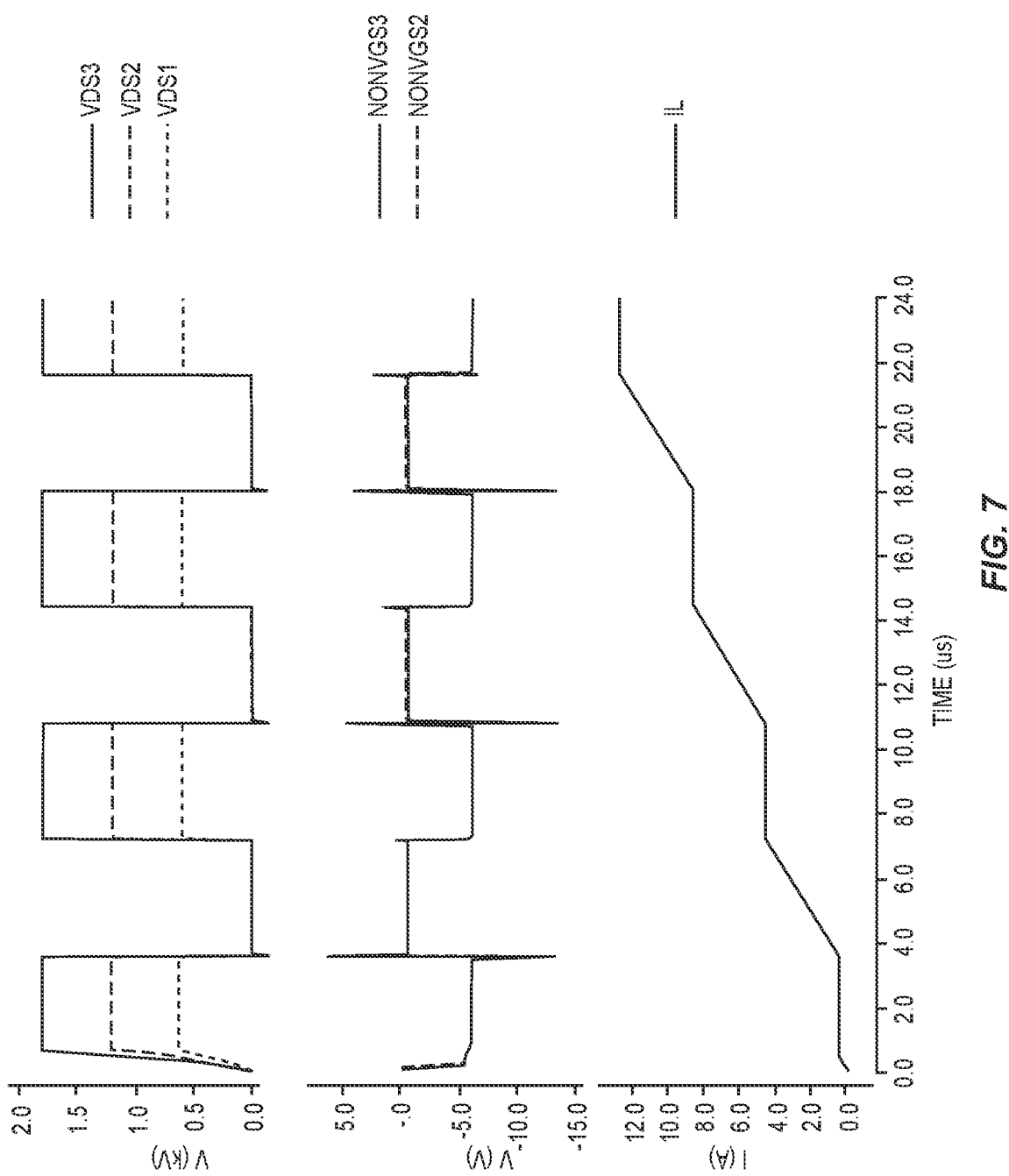
FIG. 7 illustrates a waveform diagram of voltages and load current during operation of the switch device of FIG. 6.

FIG. 7 Illustrates simulated waveforms for the unidirectional cascode discrete switch device 100 shown in FIG. 6. In FIG. 7, 'VDS3' is the full blocking voltage of the switch device 100 switching at 1.8 kV under a basic chopper cell structure, 'VDS2' is the voltage across the first normally-on transistor Q1 blocking at about 1.2 kV, and 'VDS1' is the voltage across the normally-off transistor Q2. As shown in FIG. 7, the gate-to-source voltage 'NONVGS2' of the first normally-on transistor Q1 and the gate-to-source voltage 'NONVGS3' of the additional normally-on transistor Q3 are almost perfectly in sync to turn off the entire cascode chain. The load current 'IL' supplied by the switch device 100 of FIG. 6 is also shown in FIG. 7.

In the case of the three transistors Q1, Q2, Q3 forming the cascode structure as shown in FIG. 6, each transistor Q1, Q2, Q3 may have at most a third (⅓) of the maximum rated drain-to-source voltage of the switch device 100. For example, if each transistor Q1, Q2, Q3 has a drain-to-source breakdown voltage of 650V, the switch device 100 will have a drain-to-source breakdown voltage of 1.95 kV. The unidirectional cascode discrete switch device embodiments shown in FIGS. 1 and 6 may be generalized to a normally-off transistor cascoded with N normally-on transistors where N is a positive integer 1, and with a voltage blocking device and an overvoltage protection device for each normally-on transistor. The breakdown voltage X_Q of each transistor that forms the cascode switch device is given by X_Q=X_SW/(N+1) where X_SW is the breakdown voltage of the entire cascode switch device. For a single normally-on transistor cascoded with a normally-off transistor as shown in FIG. 1, X_Q=½*X_SW. For two normally-on transistors cascoded with a normally-off transistor as shown in FIG. 6, X_Q=⅓*X_SW, etc.

Described next are embodiments of a bidirectional cascode switch device based on symmetrical and/or asymmetrical bidirectional switches. A solid-state bidirectional switch has a first source terminal, a second source terminal, a compound semiconductor substrate such as, e.g., a GaN substrate, a common drift region in the compound semiconductor substrate and in series between the two source terminals, a first gate, and a second gate. In the case of a symmetrical bidirectional switch, both gates are normally-on gates. In the case of an asymmetrical bidirectional switch, one gate is normally-on (i.e., depletion mode) and the other gate is normally-off gate (i.e., enhancement mode). For a normally-on gate, a current conduction channel is present adjacent the gate absent any voltage being applied to the gate. For a normally-off gate, a current conduction channel is not present adjacent the gate without a suitable voltage applied to the gate.

Figure 8:
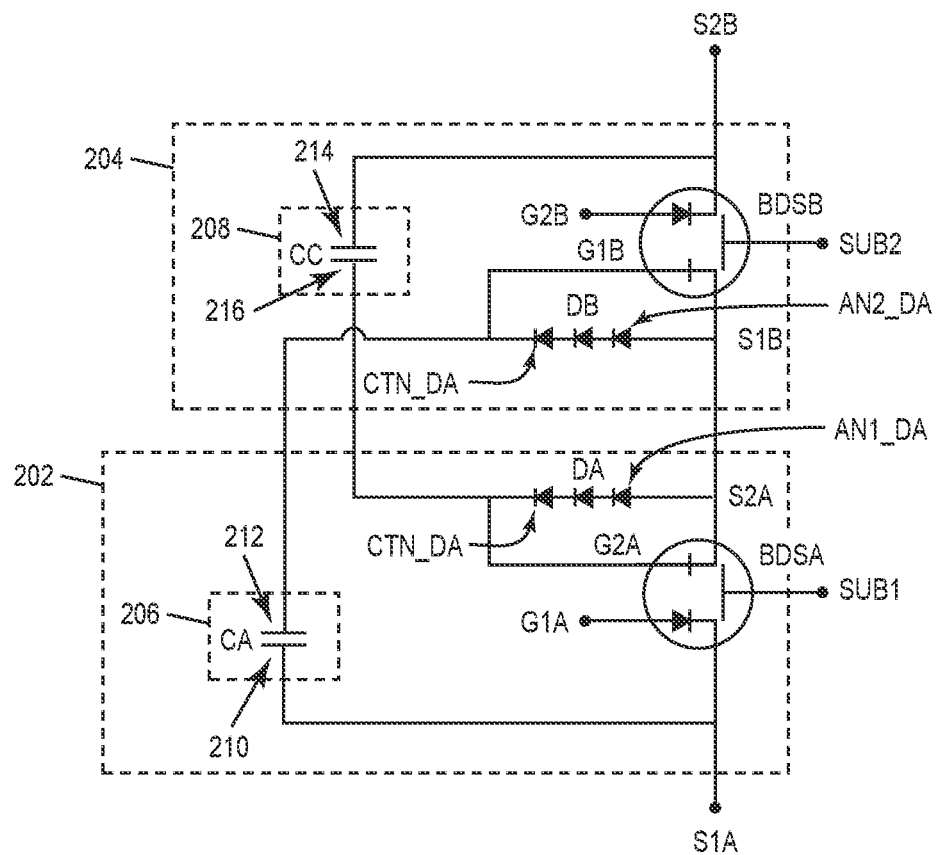
FIG. 8 illustrates a circuit schematic of an embodiment of a bidirectional cascode switch device that is based on asymmetrical bidirectional switches.

FIG. 8 illustrates an embodiment of a bidirectional cascode switch device 200 that is based on asymmetrical bidirectional switches BDSA, BDSB. The first asymmetrical bidirectional switch BDSA includes a first source S1A, a second source S2A, a normally-off gate G1A, and a normally-on gate G2A. The second asymmetrical bidirectional switch BDSB includes a first source S1B electrically connected to the second source S2A of the first asymmetrical bidirectional switch BDSA to form a cascode device, a second source S2B, a normally-off gate G2B, and a normally-on gate G1B.

The asymmetrical bidirectional switches BDSA, BDSB may be provided as discrete dies 202, 204. For example, the first asymmetrical bidirectional switch BDSA may be included in a first GaN die 202 and has at most half (½) the maximum rated source-to-source (S2B-to-S1A) voltage as the bidirectional cascode switch device 200. The second asymmetrical bidirectional switch BDSB may be included in a second GaN die 204 and have at most half (½) the maximum rated source-to-source voltage as the bidirectional cascode switch device 200. The maximum rated source-to-source voltage of the bidirectional cascode switch device 200 may be 1.2 kV or higher, for example. The asymmetrical bidirectional switches BDSA, BDSB instead may be monolithically integrated in the same die. In either case, the common drift region/compound semiconductor substrate SUB1, SUB2 of the asymmetrical bidirectional switches BDSA, BDSB are electrically isolated from one another to ensure each asymmetrical bidirectional switch BDSA, BDSB can safely block its own individual voltage.

The bidirectional cascode switch device 200 also includes a first voltage blocking device 206 electrically connected between the first source S1A of the first asymmetrical bidirectional switch BDSA and the normally-on gate G1B of the second asymmetrical bidirectional switch BDSB. The first voltage blocking device 206 blocks a portion of the voltage across the bidirectional cascode switch device 200 when the cascode device is off. A first overvoltage protection device DA turns off the normally-on gate G2A of the first asymmetrical bidirectional switch BDSA when the normally-off gate G2B of the second asymmetrical bidirectional switch BDSB turns off, such that the normally-on gate G2A of the first asymmetrical bidirectional switch BDSA is passively controlled by the normally-off gate G2B of the second asymmetrical bidirectional switch BDSB.

The bidirectional cascode switch device 200 also includes a second voltage blocking device 208 electrically connected between the second source S2B of the second asymmetrical bidirectional switch BDSB and the normally-on gate G2A of the first asymmetrical bidirectional switch BDSA. The second voltage blocking device 208 blocks a portion of the voltage across the bidirectional cascode switch device 200 when the cascode device is off. A second overvoltage protection device DB turns off the normally-on gate G1B of the second asymmetrical bidirectional switch BDSB when the normally-off gate G1A of the first asymmetrical bidirectional switch BDSA turns off, such that the normally-on gate G1B of the second asymmetrical bidirectional switch BDSB is passively controlled by the normally-off gate G1A of the first asymmetrical bidirectional switch BDSA. Accordingly, only the normally-off gates G1A, G2B of the asymmetrical bidirectional switches BDSA, BDSB are actively controlled (driven) to operate the bidirectional cascode switch device 200.

In an embodiment, the first voltage blocking device 206 is a first capacitor CA having a first terminal 210 electrically connected to the first source S1A of the first asymmetrical bidirectional switch BDSA and a second terminal 212 electrically connected to the normally-on gate G1B of the second asymmetrical bidirectional switch BDSB. Likewise, the second voltage blocking device 208 may be a second capacitor CB having a first terminal 214 electrically connected to the second source S2B of the second asymmetrical bidirectional switch BDSB and a second terminal 216 electrically connected to the normally-on gate G2A of the first asymmetrical bidirectional switch BDSA.

In an embodiment, the first overvoltage protection device DA includes one or more first diodes connected in series between the normally-on gate G2A of the first asymmetrical bidirectional switch BDSA and the second source S2A of the first asymmetrical bidirectional switch BDSA. The anode AN1_DA of the first diode of the first overvoltage protection device DA is electrically connected to the second source S2A of the first asymmetrical bidirectional switch BDSA and the cathode CTN_DA of the last diode of the first overvoltage protection device DA is electrically connected to the normally-on gate G2A of the first asymmetrical bidirectional switch BDSA. Likewise, the second overvoltage protection device DB may include one or more second diodes connected in series between the normally-on gate G1B of the second asymmetrical bidirectional switch BDSB and the first source S1B of the second asymmetrical bidirectional switch BDSB. The anode AN2_DA of the first diode of the second overvoltage protection device DB is electrically connected to the first source S1B of the second asymmetrical bidirectional switch BDSB and the cathode of last diode of the second overvoltage protection device DB is electrically connected to the normally-on gate G1B of the second asymmetrical bidirectional switch BDSB. The number of diodes included in each overvoltage protection device DA, DB depends on the desired total forward voltage, as explained above.

Both stacked asymmetrical bidirectional switches BDSA, BDSB in FIG. 8 are used to block the entire (e.g., 1.2 kV) source-to-source voltage of the bidirectional cascode switch device 200, with 100% utilisation of both devices BDSA, BDSB at all times. Furthermore, only two active gates G1A, G2B are required to fully operate the bidirectional cascode switch device 200. The bidirectional cascode switch device approach can be further extended to provide higher blocking voltage capability, as described next in more detail.

Figure 9:
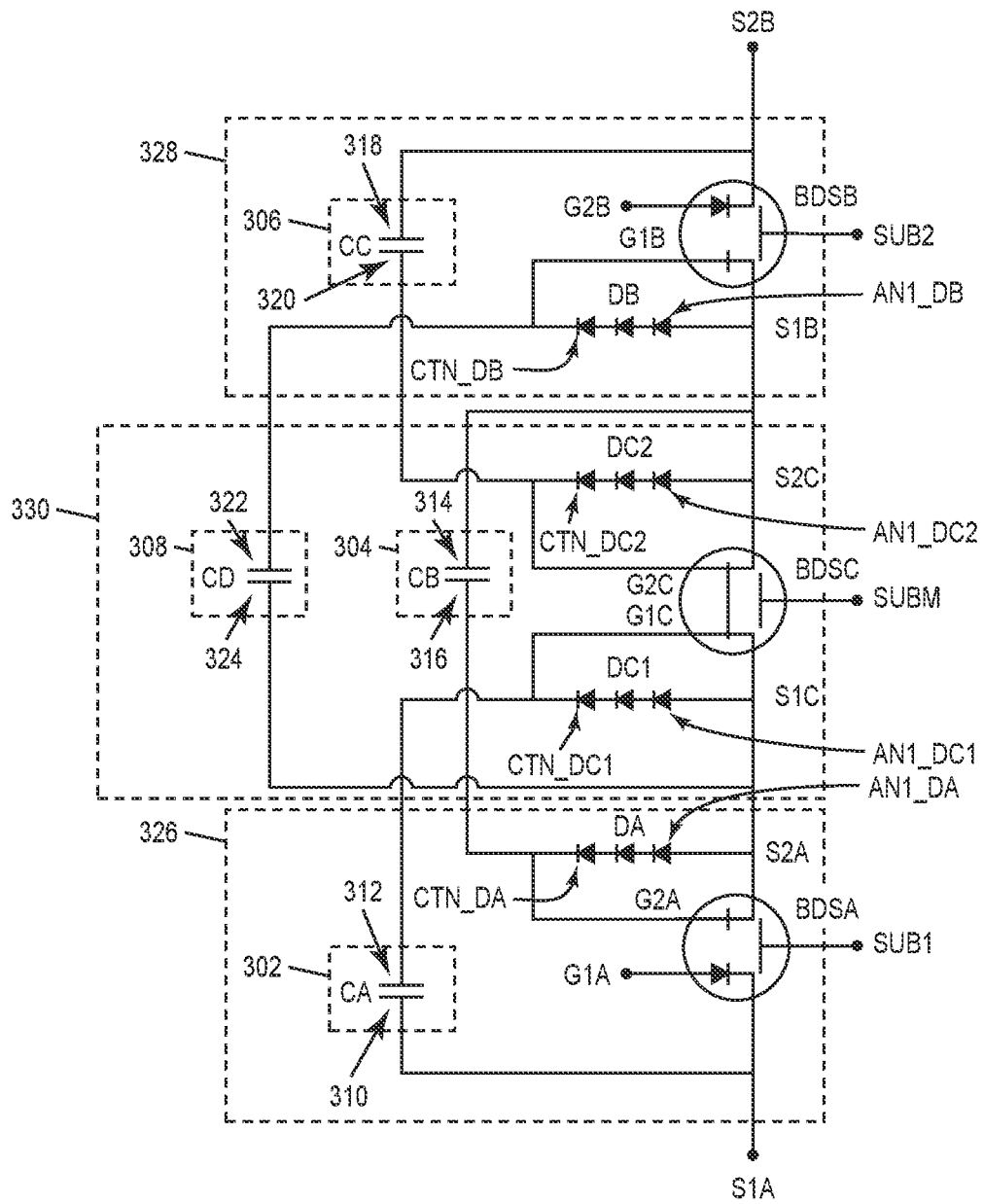
FIG. 9 illustrates a circuit schematic of an embodiment of a bidirectional cascode switch device that is based on a pair of asymmetrical bidirectional switches and at least one symmetrical bidirectional switch.

FIG. 9 illustrates an embodiment of a bidirectional cascode switch device 300 that is based on a pair of asymmetrical bidirectional switches BDSA, BDSB and at least one symmetrical bidirectional switch BDSC. The asymmetrical bidirectional switches BDSA, BDSB in FIG. 9 have the same source and gate construction as described above in connection with FIG. 8. At least one symmetrical bidirectional switch BDSC is electrically connected between the pair of asymmetrical bidirectional switches BDSA, BDSB in a cascode configuration.

More particularly, symmetrical bidirectional switch BDSC has a first source S1C electrically connected to the second source S2A of the first asymmetrical bidirectional switch BDSA to form a first part of the cascode device and a second source S2C electrically connected to the first source S1B of the second asymmetrical bidirectional switch BDSB to form a second part of the cascode device. The symmetrical bidirectional switch BDSC also has a first normally-on gate G1C and a second normally-on gate G2C, neither of which are actively controlled (driven).

A first voltage blocking device 302 is electrically connected between the first source S1A of the first asymmetrical bidirectional switch BDSA and the first normally-on gate G1C of the symmetrical bidirectional switch BDSC. The first voltage blocking device 302 blocks a portion of the source-to-source (S2B-to-S1A) voltage across the switch device 300 when the cascode device is off. A first overvoltage protection device DC1 turns off the first normally-on gate G1C of the symmetrical bidirectional switch BDSC when the normally-off gate G1A of the first asymmetrical bidirectional switch BDSA turns off, such that the first normally-on gate G1C of the symmetrical bidirectional switch BDSC is passively controlled by the normally-off gate G1A of the first asymmetrical bidirectional switch BDSA.

A second voltage blocking device 304 is electrically connected between the first source S1B of the second asymmetrical bidirectional switch BDSB and the normally-on gate G2A of the first asymmetrical bidirectional switch BDSA. The second voltage blocking device 304 blocks a portion of the source-to-source (S2B-to-S1A) voltage across the switch device 300 when the cascode device is off. A second overvoltage protection device DA turns off the normally-on gate G2A of the first asymmetrical bidirectional switch BDSA when the first normally-on gate G1C of the symmetrical bidirectional switch BDSC turns off.

A third voltage blocking device 306 is electrically connected between the second source S2B of the second asymmetrical bidirectional switch BDSB and the second normally-on gate G2C of the symmetrical bidirectional switch BDSC. The third voltage blocking device 306 blocks a portion of the source-to-source (S2B-to-S1A) voltage across the switch device 300 when the cascode device is off. A third overvoltage protection device DC2 turns off the second normally-on gate G2C of the symmetrical bidirectional switch BDSC when the normally-off gate G2B of the second a symmetrical bidirectional switch BDSB turns off, such that the second normally-on gate G2C of the symmetrical bidirectional switch BDSC is passively controlled by the normally-off gate G2B of the second asymmetrical bidirectional switch BDSB.

A fourth voltage blocking device 308 is electrically connected between the normally-on gate G1B of the second asymmetrical bidirectional switch BDSB and the first source S1C of the symmetrical bidirectional switch BDSC. The fourth voltage blocking device 308 blocks a portion of the source-to-source (S2B-to-S1A) voltage across the switch device 300 when the cascode device is off. A fourth overvoltage protection device DB turns off the normally-on gate G1B of the second asymmetrical bidirectional switch BDSB when the second normally-on gate G2C of the symmetrical bidirectional switch BDSC turns off, such that the normally-on gate G1B of the second asymmetrical bidirectional switch BDSB is passively controlled by the second normally-on gate G2C of the symmetrical bidirectional switch BDSC.

According to an embodiment, each voltage blocking device 302, 304, 306, 308 is implemented as a capacitor. For example, the first voltage blocking device 302 may be a first capacitor CA having a first terminal 310 electrically connected to the first source S1A of the first asymmetrical bidirectional switch BDSA and a second terminal 312 electrically connected to the first normally-on gate G1C of the symmetrical bidirectional switch BDSC. The second voltage blocking device 304 may be a second capacitor CB having a first terminal 314 electrically connected to the first source S1B of the second asymmetrical bidirectional switch BDSB and a second terminal 316 electrically connected to the normally-on gate G2A of the first asymmetrical bidirectional switch BDSA. The third voltage blocking device 306 may be a third capacitor CC having a first terminal 318 electrically connected to the second source S2B of the second asymmetrical bidirectional switch BDSB and a second terminal 320 electrically connected to the second normally-on gate G2C of the symmetrical bidirectional switch BDSC. The fourth voltage blocking device 308 may be a fourth capacitor CD having a first terminal 322 electrically connected to the normally-on gate G1B of the second asymmetrical bidirectional switch BDSB and a second terminal 324 electrically connected to the second source S2A of the first asymmetrical bidirectional switch BDSA.

According to an embodiment, each overvoltage protection device DA, DB, DC1, DC2 is implemented as a chain of diodes. For example, the first overvoltage protection device DA may include first diodes connected in series between the normally-on gate G2A of the first asymmetrical bidirectional switch BDSA and the second source S2A of the first asymmetrical bidirectional switch BDSA. The anode AN1_DA of the first diode of the first overvoltage protection device DA is electrically connected to the second source S2A of the first asymmetrical bidirectional switch BDSA and the cathode CTN_DA of the last diode of the first overvoltage protection device DA is electrically connected to the normally-on gate G2A of the first asymmetrical bidirectional switch BDSA.

The second overvoltage protection device DC1 may include second diodes connected in series between the first normally-on gate G1C of the symmetrical bidirectional switch BDSC and the first source S1C of the symmetrical bidirectional switch BDSC. The anode AN1_DC1 of the first diode of the second overvoltage protection device DC1 is electrically connected to the first source S1C of the symmetrical bidirectional switch BDSC and the cathode CTN_DC1 of the last diode of the second overvoltage protection device DC1 is electrically connected to the first normally-on gate G1C of the symmetrical bidirectional switch BDSC.

The third overvoltage protection device DC2 may include third diodes connected in series between the second normally-on gate G2C of the symmetrical bidirectional switch BDSC and the second source S2C of the symmetrical bidirectional switch BDSC. The anode AN1_DC2 of the first diode of the third overvoltage protection device DC2 is electrically connected to the second source S2C of the symmetrical bidirectional switch BDSC and the cathode CTN DC2 of the last diode of the third overvoltage protection device DC2 is electrically connected to the second normally-on gate G2C of the symmetrical bidirectional switch BDSC.

The fourth overvoltage protection device DB may include fourth diodes connected in series between the normally-on gate G1B of the second asymmetrical bidirectional switch BDSB and the first source S1B of the second asymmetrical bidirectional switch BDSB. The anode AN1_DB of the first diode of the fourth overvoltage protection device DB is electrically connected to the first source S1B of the second asymmetrical bidirectional switch BDSB and the cathode CTN_DB of the last diode of the fourth overvoltage protection device DB is electrically connected to the normally-on gate G1B of the second asymmetrical bidirectional switch BDSB. More generally, the number of diodes included in each overvoltage protection device DA, DB, DC1, DC2 depends on the desired total forward voltage, as explained above.

The bidirectional switches BDSA, BDSB, BDSC that form the cascode switch device 300 shown in FIG. 9 may be provided as discrete dies 326, 328, 330. For example, each bidirectional switch BDSA, BDSB, BDSC may be included in a separate GaN die 326, 328, 330 and have at most a third (⅓) of the maximum rated source-to-source (S2B-to-S1A) voltage of the switch device 300. The maximum rated source-to-source (S2B-to-S1A) voltage of the switch device 300 may be, e.g., 1.8 kV or higher.

More generally, the bidirectional cascode switch device approach uses at least two bidirectional switches electrically connected in a cascode configuration, with a first bidirectional switch (e.g., BDSA in FIGS. 8 and 9) and a second bidirectional switch (e.g., BDSB in FIGS. 8 and 9) of the at least two bidirectional switches each having a normally-on gate and a normally-off gate. Any remaining bidirectional switch (e.g., BDSC in FIGS. 8 and 9) of the at least two bidirectional switches cascoded between the first bidirectional switch and the second bidirectional switch has a first normally-on gate and a second normally-on gate. The switch device is actively controlled by the normally-off gate (e.g., G1A in FIGS. 8 and 9) of the first bidirectional switch and the normally-off gate (e.g., G2B in FIGS. 8 and 9) of the second bidirectional switch. Each normally-on gate (e.g., G2A, G1B, G1C and G2C in FIGS. 8 and 9) of the at least two bidirectional switches is electrically connected to a source of another one of the at least two bidirectional switches by a voltage blocking device (e.g., CA, CB, CC and CD in FIGS. 8 and 9) that blocks a portion of the source-to-source (e.g., S2B-to-S1A in FIGS. 8 and 9) voltage across the switch device when the switch device is off.

Described next is an embodiment of a bidirectional cascode switch device based on symmetrical bidirectional switches and low-voltage (e.g., 20V) MOS devices.

Figure 10:
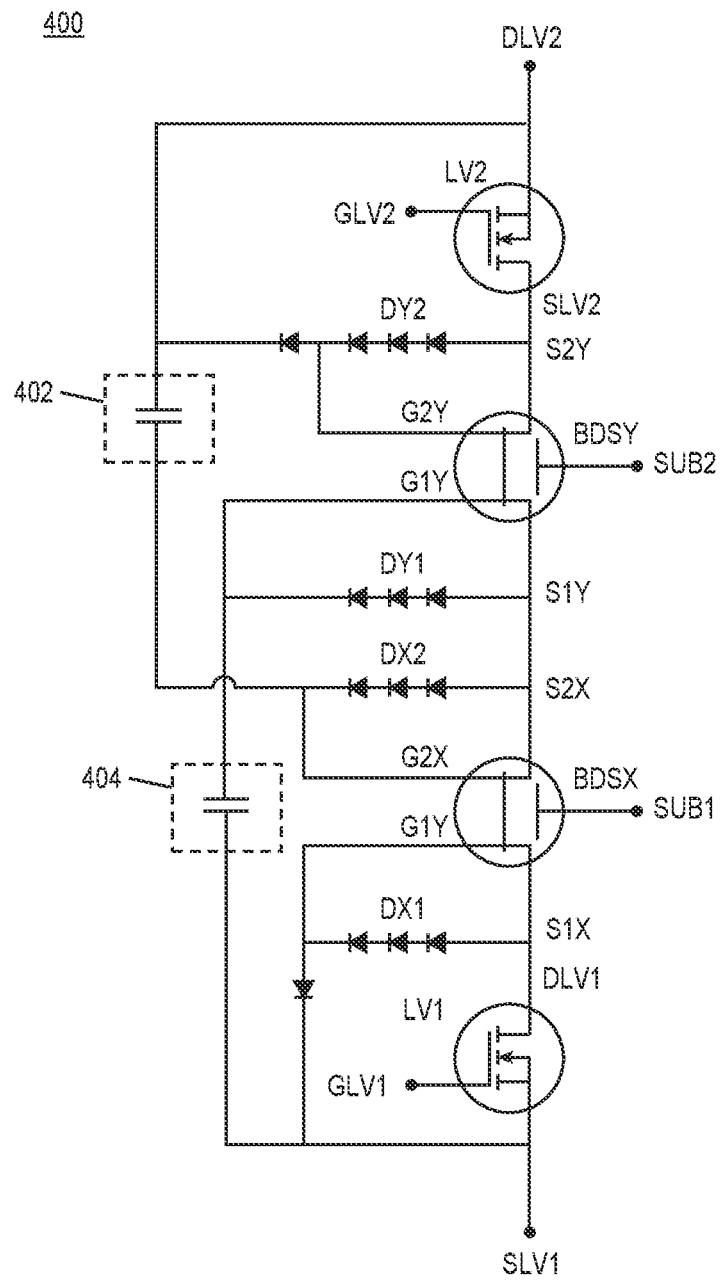
FIG. 10 illustrates a circuit schematic of an embodiment of a bidirectional cascode switch device that is based on symmetrical bidirectional stacked between low-voltage MOS switch devices in a cascode configuration.

FIG. 10 illustrates an embodiment of a bidirectional cascode switch device 400 that is based on symmetrical bidirectional BDSX, BDSY stacked between low-voltage MOS switch devices LV1, LV2 in a cascode configuration. The low-voltage MOS switch devices LV1, LV2 are normally off switches in that both low-voltage MOS switch devices LV1, LV2 are enhancement mode devices. The normally-off MOS switch devices LV1, LV2 in FIG. 10 are referred to as 'low-voltage' because the normally-off MOS switch devices LV1, LV2 have a lower breakdown voltage (e.g., 20V) compared to the symmetrical bidirectional switches BDSX, BDSY which may be 650V rated GaN devices, for example.

The at least two bidirectional switches BDSX, BDSY are electrically connected in a cascode configuration between the first normally-off MOS switch device LV1 and the second normally-off MOS switch device LV2. Each bidirectional switch BDSX, BDSY has a first normally-on gate G1X, G1Y and a second normally-on gate G2X, G2Y. A first voltage blocking device 402 such as a capacitor is electrically connected to the second normally-on gate G2X of the first bidirectional switch BDSX and blocks a portion of the drain-to-source (DLV2-to-SLV1) voltage across the switch device 400 when the switch device 400 is off. A second voltage blocking device 404 such as a capacitor is electrically connected to the first normally-on gate G1Y of the second bidirectional switch BDSY and blocks a portion of the drain-to-source (DLV2-to-SLV1) voltage across the switch device 400 when the switch device 400 is off.

A first overvoltage protection device DX1 such as a single diode or diode chain turns off the first normally-on gate G1X of the first bidirectional switch BDSX when the first (lower) normally-off MOS switch device LV1 turns off, such that the first normally-on gate G1X of the first bidirectional switch BDSX is passively controlled by the first normally-off MOS switch device LV1 turns.

A second overvoltage protection device DY1 such as a single diode or diode chain turns off the first normally-on gate G1Y of the second bidirectional switch BDSY when the first (lower) normally-off MOS switch device LV1 turns off, such that the first normally-on gate G1Y of the second bidirectional switch BDSY is passively controlled by the first normally-off MOS switch device LV1.

A third overvoltage protection device DX2 such as a single diode or diode chain turns off the second normally-on gate G2X of the first bidirectional switch BDSX when the second (upper) normally-off MOS switch device LV2 turns off, such that the second normally-on gate G2X of the first bidirectional switch BDSX is passively controlled by the second normally-off MOS switch device LV2.

A fourth overvoltage protection device DY2 such as a single diode or diode chain turns off the second normally-on gate G2Y of the second bidirectional switch BDSY when the second (upper) normally-off MOS switch device LV2 turns off, such that the second normally-on gate G2Y of the second bidirectional switch BDSY is passively controlled by the second normally-off MOS switch device LV2.

The bidirectional cascode switch device approach illustrated in FIG. 10 may be expanded to provide a higher blocking voltage capability for the switch device 400, by cascading one or more additional bidirectional switches between the first (lower) and second (upper) low-voltage MOS switch devices LV1, LV2. An additional voltage blocking device such as a capacitor is provided for each additional bidirectional switch to block a portion of the switch device drain-to-source (DLV2-to-SLV1) voltage when the switch device 400 is off. A first additional overvoltage protection device such as a single diode or diode chain is provided for turning off the lower normally-on gate of each additional bidirectional switch when the first (lower) normally-off MOS switch device LV1 turns off, such that the lower normally-on gate of each additional bidirectional switch are passively controlled by the first normally-off MOS switch device LV1. A second additional overvoltage protection device such as a single diode or diode chain is provided for turning off the upper normally-on gate of each additional bidirectional switch when the second (upper) normally-off MOS switch device LV2 turns off, such that the upper normally-on gate of each additional bidirectional switch are passively controlled by the second normally-off MOS switch device LV2.

Although the present disclosure is not so limited, the following numbered examples demonstrate one or more aspects of the disclosure.

Example 1. A switch device, comprising: a first power transistor die that includes a normally-on transistor having at most half a maximum rated drain-to-source voltage as the switch device; a second power transistor die that includes a normally-off transistor having at most half the maximum rated drain-to-source voltage as the switch device, wherein a drain of the normally-off transistor is electrically connected to a source of the normally-on transistor to form a cascode device; a voltage blocking device electrically connected between a gate of the normally-on transistor and a source of the normally-off transistor, and configured to block a portion of the voltage across the switch device when the cascode device is off; and an overvoltage protection device configured to turn off the normally-on transistor when the normally-off transistor turns off, such that the cascode device is actively controlled only by a gate of the normally-off transistor.

Example 2. The switch device of example 1, wherein the normally-on transistor is a normally-on GaN transistor, wherein the normally-off transistor is a normally-off GaN transistor, and wherein the maximum rated drain-to-source voltage of the switch device is 1.2 kV or higher.

Example 3. The switch device of example 1 or 2, wherein the voltage blocking device is a capacitor having a first terminal electrically connected to the gate of the normally-on transistor and a second terminal electrically connected to the source of the normally-off transistor.

Example 4. The switch device of example 1 or 2, wherein the voltage blocking device is a gated diode device having a drain electrically connected to the gate of the normally-on transistor and both a gate and a source electrically connected to the source of the normally-off transistor.

Example 5. The switch device of any of examples 1 through 4, wherein the overvoltage protection device comprises one or more diodes connected in series between the gate of the normally-on transistor and the source of the normally-on transistor, wherein an anode of a first one of the one or more diodes is electrically connected to the source of the normally-on transistor, and wherein a cathode of a last one of the one or more diodes is electrically connected to the gate of the normally-on transistor.

Example 6. The switch device of example 5, further comprising: an additional diode electrically connected between the gate of the normally-on transistor and the source of the normally-on transistor and antiparallel to the one or more diodes, such that a cathode of the additional diode is electrically connected to the anode of the first one of the one or more diodes and an anode of the additional diode is electrically connected to the cathode of the last one of the one or more diodes.

Example 7. The switch device of any of examples 1 through 6, further comprising: a third power transistor die that includes an additional normally-on transistor having at most a third of the maximum rated drain-to-source voltage of the switch device, wherein a source of the additional normally-on transistor is electrically connected to a drain of the normally-on transistor; an additional voltage blocking device electrically connected between a gate of the additional normally-on transistor and the source of the normally-on transistor, and configured to block a portion of the voltage across the switch device when the cascode device is off; and an additional overvoltage protection device configured to turn off the additional normally-on transistor when the normally-on transistor turns off, such that the cascode device is actively controlled only by the gate of the normally-off transistor.

Example 8. The switch device of example 7, wherein the voltage blocking device is a capacitor having a first terminal electrically connected to the gate of the normally-on transistor and a second terminal electrically connected to the source of the normally-off transistor, and wherein the additional voltage blocking device is a capacitor having a first terminal electrically connected to the gate of the additional normally-on transistor and a second terminal electrically connected to the source of the normally-on transistor.

Example 9. The switch device of example 7, wherein the voltage blocking device is a gated diode device having a drain electrically connected to the gate of the normally-on transistor and both a gate and a source electrically connected to the source of the normally-off transistor, and wherein the additional voltage blocking device is a gated diode device having a drain electrically connected to the gate of the additional normally-on transistor and both a gate and a source electrically connected to the source of the normally-on transistor.

Example 10. The switch device of any of examples 7 through 9, wherein the overvoltage protection device comprises a first one or more diodes connected in series between the gate of the normally-on transistor and the source of the normally-on transistor, wherein an anode of a first one of the first one or more diodes is electrically connected to the source of the normally-on transistor, wherein a cathode of a last one of the first one or more diodes is electrically connected to the gate of the normally-on transistor, wherein the additional overvoltage protection device comprises a second one or more diodes connected in series between the gate of the additional normally-on transistor and the source of the additional normally-on transistor, wherein an anode of a first one of the second one or more diodes is electrically connected to the source of the additional normally-on transistor, and wherein a cathode of a last one of the second one or more diodes is electrically connected to the gate of the additional normally-on transistor.

Example 11. The switch device of example 10, further comprising: a first additional diode electrically connected between the gate of the normally-on transistor and the source of the normally-on transistor and antiparallel to the first one or more diodes, such that a cathode of the first additional diode is electrically connected to the anode of the first one of the first one or more diodes and an anode of the first additional diode is electrically connected to the cathode of the last one of the first one or more diodes; and a second additional diode electrically connected between the gate of the additional normally-on transistor and the source of the additional normally-on transistor and antiparallel to the second one or more diodes, such that a cathode of the second additional diode is electrically connected to the anode of the first one of the second one or more diodes and an anode of the second additional diode is electrically connected to the cathode of the last one of the second one or more diodes.

Example 12. A switch device, comprising: a first bidirectional switch comprising a first source, a second source, a normally-off gate, and a normally-on gate; a second bidirectional switch comprising a first source electrically connected to the second source of the first bidirectional switch to form a cascode device, a second source, a normally-off gate, and a normally-on gate; a first voltage blocking device electrically connected between the first source of the first bidirectional switch and the normally-on gate of the second bidirectional switch, and configured to block a portion of the voltage across the switch device when the cascode device is off; a first overvoltage protection device configured to turn off the normally-on gate of the first bidirectional switch when the normally-off gate of the second bidirectional switch turns off, such that the normally-on gate of the first bidirectional switch is passively controlled by the normally-off gate of the second bidirectional switch; a second voltage blocking device electrically connected between the second source of the second bidirectional switch and the normally-on gate of the first bidirectional switch, and configured to block a portion of the voltage across the switch device when the cascode device is off; and a second overvoltage protection device configured to turn off the normally-on gate of the second bidirectional switch when the normally-off gate of the first bidirectional switch turns off, such that the normally-on gate of the second bidirectional switch is passively controlled by the normally-off gate of the first bidirectional switch.

Example 13. The switch device of example 12, wherein the first bidirectional switch is included in a first GaN die and has at most half a maximum rated source-to-source voltage as the switch device, wherein the second bidirectional switch is included in a second GaN die and has at most half the maximum rated source-to-source voltage as the switch device, and wherein the maximum rated source-to-source voltage of the switch device is 1.2 kV or higher.

Example 14. The switch device of example 12 or 13, wherein: the first voltage blocking device is a first capacitor having a first terminal electrically connected to the first source of the first bidirectional switch and a second terminal electrically connected to the normally-on gate of the second bidirectional switch; and the second voltage blocking device is a second capacitor having a first terminal electrically connected to the second source of the second bidirectional switch and a second terminal electrically connected to the normally-on gate of the first bidirectional switch.

Example 15. The switch device of any of examples 12 through 14, wherein: the first overvoltage protection device comprises a first one or more diodes connected in series between the normally-on gate of the first bidirectional switch and the second source of the first bidirectional switch, wherein an anode of a first one of the first one or more diodes is electrically connected to the second source of the first bidirectional switch, and wherein a cathode of a last one of the first one or more diodes is electrically connected to the normally-on gate of the first bidirectional switch; and the second overvoltage protection device comprises a second one or more diodes connected in series between the normally-on gate of the second bidirectional switch and the first source of the second bidirectional switch, wherein an anode of a first one of the second one or more diodes is electrically connected to the first source of the second bidirectional switch, and wherein a cathode of a last one of the second one or more diodes is electrically connected to the normally-on gate of the second bidirectional switch.

Example 16. A switch device, comprising: a first bidirectional switch comprising a first source, a second source, a normally-off gate, and a normally-on gate; a second bidirectional switch comprising a first source electrically connected to the second source of the first bidirectional switch to form a first part of a cascode device, a second source, a first normally-on gate, and a second normally-on gate; a third bidirectional switch comprising a first source electrically connected to the second source of the second bidirectional switch to form a second part of the cascode device, a second source, a normally-on gate, and a normally-off gate; a first voltage blocking device electrically connected between the first source of the first bidirectional switch and the first normally-on gate of the second bidirectional switch, and configured to block a portion of the voltage across the switch device when the cascode device is off; a first overvoltage protection device configured to turn off the first normally-on gate of the second bidirectional switch when the normally-off gate of the first bidirectional switch turns off, such that the first normally-on gate of the second bidirectional switch is passively controlled by the normally-off gate of the first bidirectional switch; a second voltage blocking device electrically connected between the first source of the third bidirectional switch and the normally-on gate of the first bidirectional switch, and configured to block a portion of the voltage across the switch device when the cascode device is off; a second overvoltage protection device configured to turn off the normally-on gate of the first bidirectional switch when the first normally-on gate of the second bidirectional switch turns off; a third voltage blocking device electrically connected between the second source of the third bidirectional switch and the second normally-on gate of the second bidirectional switch, and configured to block a portion of the voltage across the switch device when the cascode device is off; a third overvoltage protection device configured to turn off the second normally-on gate of the second bidirectional switch when the normally-off gate of the third bidirectional switch turns off, such that the second normally-on gate of the second bidirectional switch is passively controlled by the normally-off gate of the third bidirectional switch; a fourth voltage blocking device electrically connected between the normally-on gate of the third bidirectional switch and the first source of the second bidirectional switch, and configured to block a portion of the voltage across the switch device when the cascode device is off; and a fourth overvoltage protection device configured to turn off the normally-on gate of the third bidirectional switch when the second normally-on gate of the second bidirectional switch turns off, such that the normally-on gate of the third bidirectional switch is passively controlled by the second normally-on gate of the second bidirectional switch.

Example 17. The switch device of example 16, wherein the first bidirectional switch is included in a first GaN die and has at most a third of a maximum rated source-to-source voltage of the switch device, wherein the second bidirectional switch is included in a second GaN die and has at most a third of the maximum rated source-to-source voltage as the switch device, wherein the third bidirectional switch is included in a third GaN die and has at most a third of the maximum rated source-to-source voltage as the switch device, and wherein the maximum rated source-to-source voltage of the switch device is 1.8 kV or higher.

Example 18. The switch device of example 16 or 17, wherein: the first voltage blocking device is a first capacitor having a first terminal electrically connected to the first source of the first bidirectional switch and a second terminal electrically connected to the first normally-on gate of the second bidirectional switch; the second voltage blocking device is a second capacitor having a first terminal electrically connected to the first source of the third bidirectional switch and a second terminal electrically connected to the normally-on gate of the first bidirectional switch; the third voltage blocking device is a third capacitor having a first terminal electrically connected to the second source of the third bidirectional switch and a second terminal electrically connected to the second normally-on gate of the second bidirectional switch; and the fourth voltage blocking device is a fourth capacitor having a first terminal electrically connected to the normally-on gate of the third bidirectional switch and a second terminal electrically connected to the second source of the first bidirectional switch.

Example 19. The switch device of any of examples 16 through 18, wherein: the first overvoltage protection device comprises a first one or more diodes connected in series between the normally-on gate of the first bidirectional switch and the second source of the first bidirectional switch, wherein an anode of a first one of the first one or more diodes is electrically connected to the second source of the first bidirectional switch, and wherein a cathode of a last one of the first one or more diodes is electrically connected to the normally-on gate of the first bidirectional switch; the second overvoltage protection device comprises a second one or more diodes connected in series between the first normally-on gate of the second bidirectional switch and the first source of the second bidirectional switch, wherein an anode of a first one of the second one or more diodes is electrically connected to the first source of the second bidirectional switch, and wherein a cathode of a last one of the second one or more diodes is electrically connected to the first normally-on gate of the second bidirectional switch; the third overvoltage protection device comprises a third one or more diodes connected in series between the second normally-on gate of the second bidirectional switch and the second source of the second bidirectional switch, wherein an anode of a first one of the third one or more diodes is electrically connected to the second source of the second bidirectional switch, and wherein a cathode of a last one of the third one or more diodes is electrically connected to the second normally-on gate of the second bidirectional switch; and the fourth overvoltage protection device comprises a fourth one or more diodes connected in series between the normally-on gate of the third bidirectional switch and the first source of the third bidirectional switch, wherein an anode of a first one of the fourth one or more diodes is electrically connected to the first source of the third bidirectional switch, and wherein a cathode of a last one of the fourth one or more diodes is electrically connected to the normally-on gate of the third bidirectional switch.

Example 20. A switch device, comprising: a first normally off switch; a second normally-off switch; at least two bidirectional switches electrically connected in a cascode configuration between the first normally off switch and the second normally off switch, each bidirectional switch comprising a first normally-on gate and a second normally-on gate; a voltage blocking device electrically connected to one of the normally-on gates of each bidirectional switch and configured to block a portion of the voltage across the switch device when the switch device is off; a first overvoltage protection device configured to turn off the first normally-on gate of each bidirectional switch when the first normally-off switch turns off, such that the first normally-on gate of each bidirectional switch is passively controlled by the first normally-off switch; and a second overvoltage protection device configured to turn off the second normally-on gate of each bidirectional switch when the second normally-off switch turns off, such that the second normally-on gate of each bidirectional switch is passively controlled by the second normally-off switch.

Example 21. A switch device, comprising: at least two bidirectional switches electrically connected in a cascode configuration, wherein a first bidirectional switch and a second bidirectional switch of the at least two bidirectional switches each have a normally-on gate and a normally-off gate, wherein any remaining bidirectional switch of the at least two bidirectional switches cascoded between the first bidirectional switch and the second bidirectional switch has a first normally-on gate and a second normally-on gate, wherein the switch device is actively controlled by the normally-off gate of the first bidirectional switch and the normally-off gate of the second bidirectional switch, wherein each normally-on gate of the at least two bidirectional switches is electrically connected to a source of another one of the at least two bidirectional switches by a voltage blocking device configured to block a portion of the voltage across the switch device when the switch device is off.

As used herein, the terms "having," "containing," "including," "comprising," and the like are open-ended terms that indicate the presence of stated elements or features, but do not preclude additional elements or features.

The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switch device, comprising:
a first power transistor die that includes a normally-on transistor having at most half a maximum rated drain-to-source voltage as the switch device;
a second power transistor die that includes a normally-off transistor having at most half the maximum rated drain-to-source voltage as the switch device, wherein a drain of the normally-off transistor is electrically connected to a source of the normally-on transistor to form a cascode device;
a voltage blocking device electrically connected between a gate of the normally-on transistor and a source of the normally-off transistor, and configured to block a portion of the voltage across the switch device when the cascode device is off;
an overvoltage protection device configured to turn off the normally-on transistor when the normally-off transistor turns off, such that the cascode device is actively controlled only by a gate of the normally-off transistor;
a third power transistor die that includes an additional normally-on transistor having at most a third of the maximum rated drain-to-source voltage of the switch device, wherein a source of the additional normally-on transistor is electrically connected to a drain of the normally-on transistor;
an additional voltage blocking device electrically connected between a gate of the additional normally-on transistor and the source of the normally-on transistor, and configured to block a portion of the voltage across the switch device when the cascode device is off; and
an additional overvoltage protection device configured to turn off the additional normally-on transistor when the normally-on transistor turns off, such that the cascode device is actively controlled only by the gate of the normally-off transistor.

2. The switch device of claim 1, wherein the normally-on transistor is a normally-on GaN transistor, wherein the normally-off transistor is a normally-off GaN transistor, and wherein the maximum rated drain-to-source voltage of the switch device is 1.2 kV or higher.

3. The switch device of claim 1, wherein the voltage blocking device is a capacitor having a first terminal electrically connected to the gate of the normally-on transistor and a second terminal electrically connected to the source of the normally-off transistor.

4. The switch device of claim 1, wherein the voltage blocking device is a gated diode device having a drain electrically connected to the gate of the normally-on transistor and both a gate and a source electrically connected to the source of the normally-off transistor.

5. The switch device of claim 1, wherein the overvoltage protection device comprises one or more diodes connected in series between the gate of the normally-on transistor and the source of the normally-on transistor, wherein an anode of a first one of the one or more diodes is electrically connected to the source of the normally-on transistor, and wherein a cathode of a last one of the one or more diodes is electrically connected to the gate of the normally-on transistor.

6. The switch device of claim 5, further comprising:
an additional diode electrically connected between the gate of the normally-on transistor and the source of the normally-on transistor and antiparallel to the one or more diodes, such that a cathode of the additional diode is electrically connected to the anode of the first one of the one or more diodes and an anode of the additional diode is electrically connected to the cathode of the last one of the one or more diodes.

7. The switch device of claim 1, wherein the voltage blocking device is a capacitor having a first terminal electrically connected to the gate of the normally-on transistor and a second terminal electrically connected to the source of the normally-off transistor, and wherein the additional voltage blocking device is a capacitor having a first terminal electrically connected to the gate of the additional normally-on transistor and a second terminal electrically connected to the source of the normally-on transistor.

8. The switch device of claim 1, wherein the voltage blocking device is a gated diode device having a drain electrically connected to the gate of the normally-on transistor and both a gate and a source electrically connected to the source of the normally-off transistor, and wherein the additional voltage blocking device is a gated diode device having a drain electrically connected to the gate of the additional normally-on transistor and both a gate and a source electrically connected to the source of the normally-on transistor.

9. The switch device of claim 1, wherein the overvoltage protection device comprises a first one or more diodes connected in series between the gate of the normally-on transistor and the source of the normally-on transistor, wherein an anode of a first one of the first one or more diodes is electrically connected to the source of the normally-on transistor, wherein a cathode of a last one of the first one or more diodes is electrically connected to the gate of the normally-on transistor, wherein the additional overvoltage protection device comprises a second one or more diodes connected in series between the gate of the additional normally-on transistor and the source of the additional normally-on transistor, wherein an anode of a first one of the second one or more diodes is electrically connected to the source of the additional normally-on transistor, and wherein a cathode of a last one of the second one or more diodes is electrically connected to the gate of the additional normally-on transistor.

10. The switch device of claim 9, further comprising:
a first additional diode electrically connected between the gate of the normally-on transistor and the source of the normally-on transistor and antiparallel to the first one or more diodes, such that a cathode of the first additional diode is electrically connected to the anode of the first one of the first one or more diodes and an anode of the first additional diode is electrically connected to the cathode of the last one of the first one or more diodes; and
a second additional diode electrically connected between the gate of the additional normally-on transistor and the source of the additional normally-on transistor and antiparallel to the second one or more diodes, such that a cathode of the second additional diode is electrically connected to the anode of the first one of the second one or more diodes and an anode of the second additional diode is electrically connected to the cathode of the last one of the second one or more diodes.

11. A switch device, comprising:
a first bidirectional switch comprising a first source, a second source, a normally-off gate, and a normally-on gate;
a second bidirectional switch comprising a first source electrically connected to the second source of the first bidirectional switch to form a cascode device, a second source, a normally-off gate, and a normally-on gate;
a first voltage blocking device electrically connected between the first source of the first bidirectional switch and the normally-on gate of the second bidirectional switch, and configured to block a portion of the voltage across the switch device when the cascode device is off;
a first overvoltage protection device configured to turn off the normally-on gate of the first bidirectional switch when the normally-off gate of the second bidirectional switch turns off, such that the normally-on gate of the first bidirectional switch is passively controlled by the normally-off gate of the second bidirectional switch;
a second voltage blocking device electrically connected between the second source of the second bidirectional switch and the normally-on gate of the first bidirectional switch, and configured to block a portion of the voltage across the switch device when the cascode device is off; and
a second overvoltage protection device configured to turn off the normally-on gate of the second bidirectional switch when the normally-off gate of the first bidirectional switch turns off, such that the normally-on gate of the second bidirectional switch is passively controlled by the normally-off gate of the first bidirectional switch.

12. The switch device of claim 11, wherein the first bidirectional switch is included in a first GaN die and has at most half a maximum rated source-to-source voltage as the switch device, wherein the second bidirectional switch is included in a second GaN die and has at most half the maximum rated source-to-source voltage as the switch device, and wherein the maximum rated source-to-source voltage of the switch device is 1.2 kV or higher.

13. The switch device of claim 11, wherein:
the first voltage blocking device is a first capacitor having a first terminal electrically connected to the first source of the first bidirectional switch and a second terminal electrically connected to the normally-on gate of the second bidirectional switch; and
the second voltage blocking device is a second capacitor having a first terminal electrically connected to the second source of the second bidirectional switch and a second terminal electrically connected to the normally-on gate of the first bidirectional switch.

14. The switch device of claim 11, wherein:
the first overvoltage protection device comprises a first one or more diodes connected in series between the normally-on gate of the first bidirectional switch and the second source of the first bidirectional switch, wherein an anode of a first one of the first one or more diodes is electrically connected to the second source of the first bidirectional switch, and wherein a cathode of a last one of the first one or more diodes is electrically connected to the normally-on gate of the first bidirectional switch; and the second overvoltage protection device comprises a second one or more diodes connected in series between the normally-on gate of the second bidirectional switch and the first source of the second bidirectional switch, wherein an anode of a first one of the second one or more diodes is electrically connected to the first source of the second bidirectional switch, and wherein a cathode of a last one of the second one or more diodes is electrically connected to the normally-on gate of the second bidirectional switch.

15. A switch device, comprising:

a first bidirectional switch comprising a first source, a second source, a normally-off gate, and a normally-on gate;

a second bidirectional switch comprising a first source electrically connected to the second source of the first bidirectional switch to form a first part of a cascode device, a second source, a first normally-on gate, and a second normally-on gate;

a third bidirectional switch comprising a first source electrically connected to the second source of the second bidirectional switch to form a second part of the cascode device, a second source, a normally-on gate, and a normally-off gate;

a first voltage blocking device electrically connected between the first source of the first bidirectional switch and the first normally-on gate of the second bidirectional switch, and configured to block a portion of the voltage across the switch device when the cascode device is off;

a first overvoltage protection device configured to turn off the first normally-on gate of the second bidirectional switch when the normally-off gate of the first bidirectional switch turns off, such that the first normally-on gate of the second bidirectional switch is passively controlled by the normally-off gate of the first bidirectional switch;

a second voltage blocking device electrically connected between the first source of the third bidirectional switch and the normally-on gate of the first bidirectional switch, and configured to block a portion of the voltage across the switch device when the cascode device is off;

a second overvoltage protection device configured to turn off the normally-on gate of the first bidirectional switch when the first normally-on gate of the second bidirectional switch turns off;

a third voltage blocking device electrically connected between the second source of the third bidirectional switch and the second normally-on gate of the second bidirectional switch, and configured to block a portion of the voltage across the switch device when the cascode device is off;

a third overvoltage protection device configured to turn off the second normally-on gate of the second bidirectional switch when the normally-off gate of the third bidirectional switch turns off, such that the second normally-on gate of the second bidirectional switch is passively controlled by the normally-off gate of the third bidirectional switch;

a fourth voltage blocking device electrically connected between the normally-on gate of the third bidirectional switch and the first source of the second bidirectional switch, and configured to block a portion of the voltage across the switch device when the cascode device is off; and a fourth overvoltage protection device configured to turn off the normally-on gate of the third bidirectional switch when the second normally-on gate of the second bidirectional switch turns off, such that the normally-on gate of the third bidirectional switch is passively controlled by the second normally-on gate of the second bidirectional switch.

16. The switch device of claim 15, wherein the first bidirectional switch is included in a first GaN die and has at most a third of a maximum rated source-to-source voltage of the switch device, wherein the second bidirectional switch is included in a second GaN die and has at most a third of the maximum rated source-to-source voltage as the switch device, wherein the third bidirectional switch is included in a third GaN die and has at most a third of the maximum rated source-to-source voltage as the switch device, and wherein the maximum rated source-to-source voltage of the switch device is 1.8 kV or higher.

17. The switch device of claim 15, wherein:

the first voltage blocking device is a first capacitor having a first terminal electrically connected to the first source of the first bidirectional switch and a second terminal electrically connected to the first normally-on gate of the second bidirectional switch;

the second voltage blocking device is a second capacitor having a first terminal electrically connected to the first source of the third bidirectional switch and a second terminal electrically connected to the normally-on gate of the first bidirectional switch;

the third voltage blocking device is a third capacitor having a first terminal electrically connected to the second source of the third bidirectional switch and a second terminal electrically connected to the second normally-on gate of the second bidirectional switch; and the fourth voltage blocking device is a fourth capacitor having a first terminal electrically connected to the normally-on gate of the third bidirectional switch and a second terminal electrically connected to the second source of the first bidirectional switch.

18. The switch device of claim 15, wherein:

the first overvoltage protection device comprises a first one or more diodes connected in series between the normally-on gate of the first bidirectional switch and the second source of the first bidirectional switch, wherein an anode of a first one of the first one or more diodes is electrically connected to the second source of the first bidirectional switch, and wherein a cathode of a last one of the first one or more diodes is electrically connected to the normally-on gate of the first bidirectional switch;

the second overvoltage protection device comprises a second one or more diodes connected in series between the first normally-on gate of the second bidirectional switch and the first source of the second bidirectional switch, wherein an anode of a first one of the second one or more diodes is electrically connected to the first source of the second bidirectional switch, and wherein a cathode of a last one of the second one or more diodes is electrically connected to the first normally-on gate of the second bidirectional switch;

the third overvoltage protection device comprises a third one or more diodes connected in series between the second normally-on gate of the second bidirectional switch and the second source of the second bidirectional switch, wherein an anode of a first one of the third one or more diodes is electrically connected to the second source of the second bidirectional switch, and wherein a cathode of a last one of the third one or more diodes is electrically connected to the second normally-on gate of the second bidirectional switch; and the fourth overvoltage protection device comprises a fourth one or more diodes connected in series between the normally-on gate of the third bidirectional switch and the first source of the third bidirectional switch, wherein an anode of a first one of the fourth one or more diodes is electrically connected to the first source of the third bidirectional switch, and wherein a cathode of a last one of the fourth one or more diodes is electrically connected to the normally-on gate of the third bidirectional switch.

19. A switch device, comprising:
a first normally-off switch;
a second normally-off switch;
at least two bidirectional switches electrically connected in a cascode configuration between the first normally-off switch and the second normally-off switch, each bidirectional switch comprising a first normally-on gate and a second normally-on gate;
a voltage blocking device electrically connected to one of the normally-on gates of each bidirectional switch and configured to block a portion of the voltage across the switch device when the switch device is off;
a first overvoltage protection device configured to turn off the first normally-on gate of each bidirectional switch when the first normally-off switch turns off, such that the first normally-on gate of each bidirectional switch is passively controlled by the first normally-off switch; and
a second overvoltage protection device configured to turn off the second normally-on gate of each bidirectional switch when the second normally-off switch turns off, such that the second normally-on gate of each bidirectional switch is passively controlled by the second normally-off switch.

20. A switch device, comprising:
at least two bidirectional switches electrically connected in a cascode configuration,
wherein a first bidirectional switch and a second bidirectional switch of the at least two bidirectional switches each have a normally-on gate and a normally-off gate,
wherein any remaining bidirectional switch of the at least two bidirectional switches cascoded between the first bidirectional switch and the second bidirectional switch has a first normally-on gate and a second normally-on gate,
wherein the switch device is actively controlled by the normally-off gate of the first bidirectional switch and the normally-off gate of the second bidirectional switch,
wherein each normally-on gate of the at least two bidirectional switches is electrically connected to a source of another one of the at least two bidirectional switches by a voltage blocking device configured to block a portion of the voltage across the switch device when the switch device is off.

21. A switch device, comprising:
a first power transistor die that includes a normally-on transistor having at most half a maximum rated drain-to-source voltage as the switch device;
a second power transistor die that includes a normally-off transistor having at most half the maximum rated drain-to-source voltage as the switch device, wherein a drain of the normally-off transistor is electrically connected to a source of the normally-on transistor to form a cascode device;
a voltage blocking device electrically connected between a gate of the normally-on transistor and a source of the normally-off transistor, and configured to block a portion of the voltage across the switch device when the cascode device is off; and
an overvoltage protection device configured to turn off the normally-on transistor when the normally-off transistor turns off, such that the cascode device is actively controlled only by a gate of the normally-off transistor,
wherein the voltage blocking device is a gated diode device having a drain electrically connected to the gate of the normally-on transistor and both a gate and a source electrically connected to the source of the normally-off transistor.

22. A switch device, comprising:
a first power transistor die that includes a normally-on transistor having at most half a maximum rated drain-to-source voltage as the switch device;
a second power transistor die that includes a normally-off transistor having at most half the maximum rated drain-to-source voltage as the switch device, wherein a drain of the normally-off transistor is electrically connected to a source of the normally-on transistor to form a cascode device;
a voltage blocking device electrically connected between a gate of the normally-on transistor and a source of the normally-off transistor, and configured to block a portion of the voltage across the switch device when the cascode device is off;
an overvoltage protection device configured to turn off the normally-on transistor when the normally-off transistor turns off, such that the cascode device is actively controlled only by a gate of the normally-off transistor, wherein the overvoltage protection device comprises one or more diodes connected in series between the gate of the normally-on transistor and the source of the normally-on transistor, wherein an anode of a first one of the one or more diodes is electrically connected to the source of the normally-on transistor, and wherein a cathode of a last one of the one or more diodes is electrically connected to the gate of the normally-on transistor; and
an additional diode electrically connected between the gate of the normally-on transistor and the source of the normally-on transistor and antiparallel to the one or more diodes, such that a cathode of the additional diode is electrically connected to the anode of the first one of the one or more diodes and an anode of the additional diode is electrically connected to the cathode of the last one of the one or more diodes.

* * * * *